US006303733B1

(12) United States Patent
Lau et al.

(10) Patent No.: US 6,303,733 B1
(45) Date of Patent: *Oct. 16, 2001

(54) POLY(ARYLENE ETHER) HOMOPOLYMER COMPOSITIONS AND METHODS OF MANUFACTURE THEREOF

(75) Inventors: Kreisler S. Y. Lau, Sunnyvale, CA (US); Tian-An Chen, Duluth, GA (US); Boris A. Korolev, San Jose; Emma Brouk, Sunnyvale, both of CA (US)

(73) Assignee: AlliedSignal Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,478

(22) Filed: Nov. 20, 1998

Related U.S. Application Data

(63) Continuation-in-part of application No. 08/990,157, filed on Dec. 12, 1997.

(51) Int. Cl.$^7$ .................................................. C08G 79/02
(52) U.S. Cl. ........................ 528/169; 528/86; 528/125; 528/167; 528/401; 528/403; 528/410; 528/422; 528/480; 528/491; 528/503; 525/390; 437/233; 437/234; 437/235; 428/411.1
(58) Field of Search .......................... 528/169, 86, 125, 528/167, 401, 403, 410, 422, 480, 491, 503; 525/390; 437/233, 234, 235; 428/411.1

(56) References Cited

U.S. PATENT DOCUMENTS

| 4,806,618 | 2/1989 | Imai et al. ........................... 528/125 |
| 5,003,178 | 3/1991 | Livesay ................................. 250/492 |
| 5,145,936 | 9/1992 | Mercer ................................... 528/86 |
| 5,185,454 | 2/1993 | Bader et al. ......................... 549/240 |

(List continued on next page.)

FOREIGN PATENT DOCUMENTS

| 0581272 | * | 7/1993 | (EP) . | |
| 0 581 272 A1 | | 7/1993 | (EP) | ............................... C07C/25/24 |
| 0 755 957 A1 | | 1/1997 | (EP) | ............................... C08G/65/40 |
| 0755 957A1 | | 1/1997 | (EP) | ............................... C08G/65/40 |
| 0 758 664 A1 | | 2/1997 | (EP) | ............................... C08G/65/40 |
| WO 93/09079 | | 5/1993 | (WO) | ............................. C07C/15/54 |

OTHER PUBLICATIONS

L. Brandsma et al. Synthetic Communication, vol. 20, No. 12, 1990, pp. 1889–1892 "An efficient and general procedure for the cross–coupling of Trimethylmylacetylene and virylic aromatic or hetero–aromatic bromides".*

Rusanov, et al. "Synthesis and Investigation of Aromatic Polythers Bearing Acetylenic Groups in Backbone", Polymer Science, Ser. A, vol. 40, No. 3, pp. 220–225, 1998.

Wang, et al., "Novel macrocyclic aryl ether oligomers containing a dipphenylacetylene moiety: synthesis, characterization and ring–opening polymerization", Polymer No. 2, pp. 469–482, 1997.

(List continued on next page.)

*Primary Examiner*—Duc Truong
(74) *Attorney, Agent, or Firm*—Skjerven, Morrill, MacPherson, Franklin and Friel

(57) ABSTRACT

Dielectric compositions encompassing one or more poly (arylene ether) polymers are provided. The dielectric compositions have the repetitive structural unit:

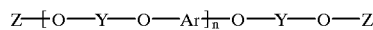

where n=1 to 200, Y and Ar are each a divalent arylene radical, Y derived from bisphenol compounds of general formula HO—Y—OH, Ar derived from difluoro diarylacetylenes and/or ethynylated benzophenones of general formula F—Ar—F and Z is optionally hydrogen, a methyl group or derived from a monofluoro-benzophenone derivative of general formula Z—F. Such poly(arylene ether) polymers are employed with a variety of microelectronic devices, for example, integrated circuits and multichip modules.

34 Claims, 3 Drawing Sheets

U.S. PATENT DOCUMENTS

| | | | |
|---|---|---|---|
| 5,189,138 | * 2/1993 | Trofimenko et al. | 528/125 |
| 5,233,046 | 8/1993 | Hay et al. | 548/257 |
| 5,248,838 | 9/1993 | Massirio et al. | 568/727 |
| 5,268,444 | 12/1993 | Jensen et al. | 528/125 |
| 5,429,995 | 7/1995 | Nishiyama et al. | 437/238 |
| 5,446,204 | 8/1995 | Bryant et al. | 568/333 |
| 5,484,687 | 1/1996 | Watanabe et al. | 430/296 |
| 5,498,803 | 3/1996 | Hergenrother et al. | 568/646 |
| 5,602,060 | 2/1997 | Kobayashi et al. | 437/238 |
| 5,648,448 | 7/1997 | Marrocco, III et al. | 528/125 |
| 5,658,994 | 8/1997 | Burgoyne, Jr. et al. | 525/390 |
| 5,660,920 | 8/1997 | Buckley et al. | 428/209 |
| 5,660,921 | 8/1997 | Ahn et al. | 428/209 |

OTHER PUBLICATIONS

Delfort, et al., "Ethynyl–Terminated Polyethers From New End–Capping Agents: Synthesis and Characterization", Journal of Polymer Science, Part A: Polymer Chemistry Edition 28, No. 9, Aug. 1990.

Strukelj, et al., "Novel Poly(aryl ether)s from Bis(4–fluorophenyl)acetylene", Macromolecules, vol. 26, No. 7, p. 1777–1778, 1993.

Article 17(3), May 17, 2000, PCT.

Middleton, "Thermost Polymer Coating With Low Dielectric and high Thermal Stability for ULSI Interlayer Dielectric", The Dow Chemical Company, 3 pages.

Petes, "Pursuing the Perfect Low–k Dielectric", FabLink Corporation & Semiconductor International, 9 pages (1998).

Chemical Abstracts, vol. 118, No. 6, Apr. 19, 1993, Abstract No. 148163, Strukelj, Marco et al., "Novel poly(aryl ethers) from bis(4–fluorophenyl)acetylene" XP002101652.

Chemical Abstracts, vol. 117, No. 26, Dec. 28, 1992, Abstract No. 261070, Yang, Mei et al., "Spectral and lasing properties of new dyes in ultraviolet region", XP002101651.

* cited by examiner

POLY(ARYLENE ETHER) HOMOPOLYMER COMPOSITIONS AND METHODS OF MANUFACTURE THEREOF

RELATED APPLICATIONS

This application is a continuation-in part of U.S. patent application Ser. No. 08/990,157 entitled "POLY(ARYLENE ETHER) COMPOSITIONS AND METHODS OF MANUFACTURE THEREOF", filed on Dec. 12, 1997 now allowed on Sep. 2, 1999, assigned to the assignee of the present application, and incorporated herein by reference.

BACKGROUND

1. Scope of the Invention

The present invention relates generally to poly(arylene ether) compositions and methods of manufacture thereof, and more specifically to poly(arylene ether) polymers that form low dielectric constant, low moisture absorbing and high glass transition temperature dielectric films for microelectronic devices, and methods of manufacture thereof.

2. Related Art

Advances in the semiconductor industry are characterized by the introduction of new generations of integrated circuits (IC's) having higher performance and greater functionality than that of the previous generation. These advances are often the result of reducing the size of the IC devices. However, as device geometries approach and then go beyond dimensions as small as 0.25 micron ($\mu$m), the dielectric constant of an insulating material used between conductive paths, for example silicon oxide ($SiO_2$), becomes an increasingly significant factor in device performance. As the distance between adjacent conductive paths becomes smaller, the resulting capacitance, a function of the dielectric of the insulating material divided by the distance between conductive paths, increases. As a result, capacitive coupling between adjacent conductive paths is increased. The increased capacitance additionally results in increased power consumption for the IC and an increased RC time constant. The latter resulting in reduced signal propagation speed. In addition, the increased capacitance can result in cross talk between adjacent paths, or layers of paths, thus lowering the signal to noise ratio.

Organic insulating materials can provide films having dielectric constants in the range of approximately 2.0–3.0, significantly lower than the 3.9 of a $SiO_2$ film. Thus reduced capacitance is provided and the aforementioned problems alleviated. However, any organic material must meet other criteria in addition to a low dielectric constant before it can be used to replace the commonly employed $SiO_2$. For example, the material should have a glass transition temperature (Tg) of at least 350 degrees Celsius (° C.), good thermal stability to and above the Tg, a low moisture absorption rate and good retention of the storage modulus above the material's Tg.

One attempt at such an organic material and an IC application that uses the material are the subjects of European Patent Application EP 0 755 957 A1, "NONHALOGENATED POLY(ARYLENE ETHERS)," ('957 application), and a related U.S. Pat. No. 5,658,994, "NONFUNCTIONALIZED POLY(ARYLENE ETHER) DIELECTRICS," ('994 patent), both by Burgoyne, Jr., et al. The '994 patent is directed to "a dielectric material provided on a microelectronic device, wherein the dielectric material contains a poly(arylene ether) polymer" (column 3, lines 25–27). The '957 application, is directed to "the field of poly(arylene ethers) which do not contain any metal-reactive groups in the polymer, such as activated fluorine substituents." (page 2, lines 1–2). The poly(arylene ethers) of the '957 application appear to be the dielectric material of the '994 patent. However, the poly(arylene ethers) of Burgoyne Jr., et. al., among other things, have glass transition temperatures below 300° C. (Table 3 in the '957 application) which can be problematic during commonly employed Chemical Vapor Depositions of tungsten at 450° C. In addition, Burgoyne, Jr., et al. suggests the use of adhesion promoters with the poly(arylene ethers) of the '994 patent (see column 9, lines 41–50). However, the use of adhesion promoters, such as the hexamethyldisilazane suggested by Burgoyne, Jr., et al. typically require an additional process step and often result in an increase in the amount of outgassing from the polymer film hence, lower thermal stability.

Another example of an aromatic hydrocarbon polymer for use a dielectric material has been announced by the Dow Chemical Company under the tradename SILK. The polymer contains no silicon or fluorine. This material was described to possess high thermal stability and Tg and a dielectric constant of 2.65. An adhesion promotor is typically required with this material, as are long cure times and special process equipment.

Yet another example of an organic material for use as a dielectric material is a family of fluorinated poly(arylene ethers) having dielectric constants in the range of 2.36–2.65. These fluorinated poly(arylene ethers) are described in U.S. patent application, Ser. No. 08/665,189 ('189 application) filed Jun. 14, 1996. The '189 application is entitled "IMPROVED POLY(ARYLENE ETHER) COMPOSITIONS AND THE METHOD FOR THEIR MANUFACTURE" and assigned to the assignee of the present application. However, while the polymers of the '189 application have acceptably low dielectric constants and high Tg, adhesion of these polymers to common semiconductor surfaces, without the use of adhesion promoters, is at times problematic.

Thus it would be desirable to manufacture and use an organic dielectric material having a Tg value above 350° C. and preferably above 400° C. It would also be desirable for the organic dielectrics manufactured to have good adhesion to a variety of common semiconductor surfaces without the use of adhesion promoters. In addition, it would be desirable for the organic dielectrics to have good gap-filling qualities and thus completely fill spaces between conductive traces of 0.25 $\mu$m or less. Additionally, it would be desirable to manufacture and use an organic dielectric material having good dimensional stability above the dielectric material's Tg, e.g. storage modulus. It would further be desirable for the organic dielectrics to have good thermal stability, as evidenced by little or no outgassing and low moisture absorptivity up to and beyond the Tg. For use as an interlayer dielectric in a multilevel metal construct, it would be desirable for the organic film to additionally be stable toward a variety of common etching and planarization, i.e., CMP (chemical mechanical polishing) processes. It would further be desirable for the organic dielectrics to be easily processed in high yield to substrates, for example using standard spin-bake-cure processing techniques, using the lowest possible cure temperatures and short cure times, thus insuring their cost effectiveness. Finally, it would be desirable for the organic dielectrics manufactured to also be applicable to use in other microelectronic devices in addition to ICs, for example printed circuit boards (PCBs), multichip modules (MCM's) and the like.

SUMMARY

In accordance with this invention some poly(arylene ethers) are provided having a structure:

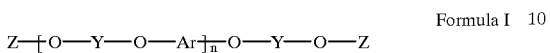

Formula I wherein n=1 to 200; Y is a divalent arylene radical selected from a first group of divalent arylene radicals; Ar is a divalent arylene radical selected from a second group of divalent arylene radicals; and Z is either hydrogen, or an end-cap encompassing a methyl group or a monovalent arylene radical, EC, selected from a group of monovalent arylene radicals; the first group, Y, of divalent arylene radicals consisting of:

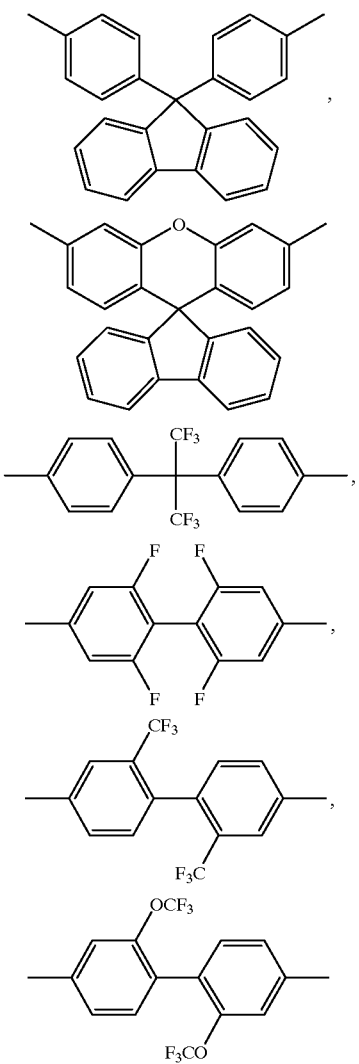

-continued

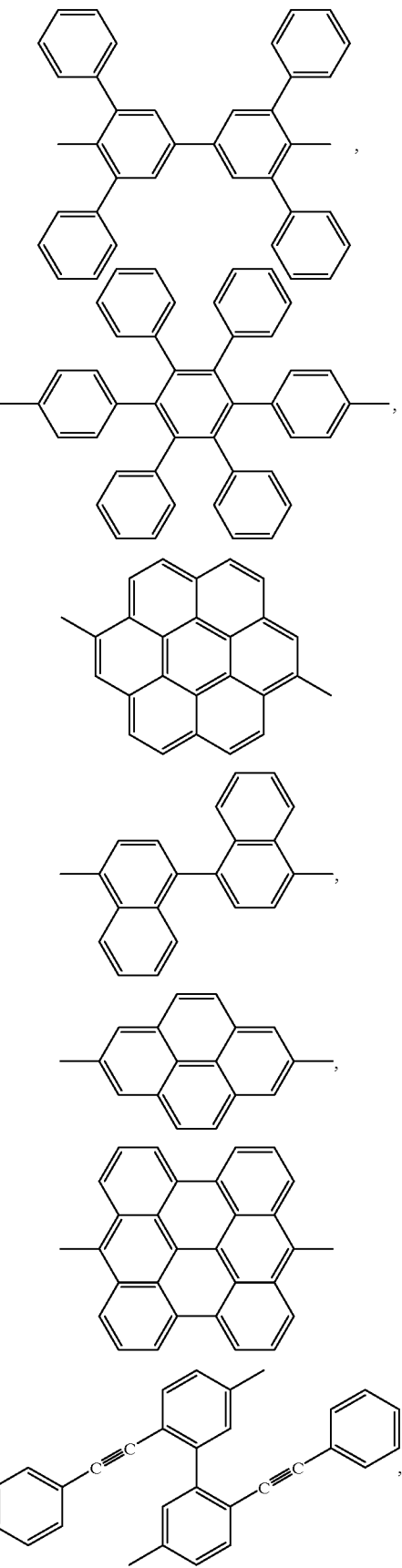

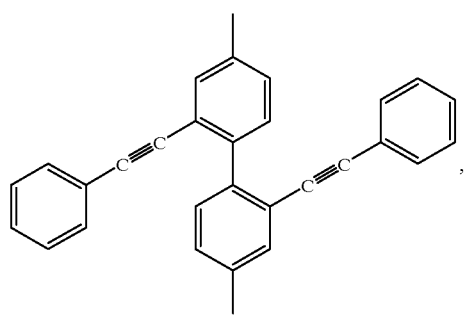
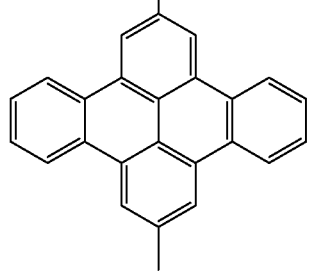
and mixtures thereof; the second group, Ar, of divalent arylene radicals consisting of:
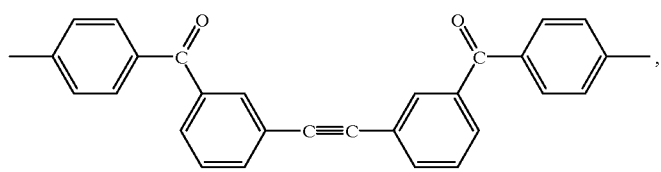
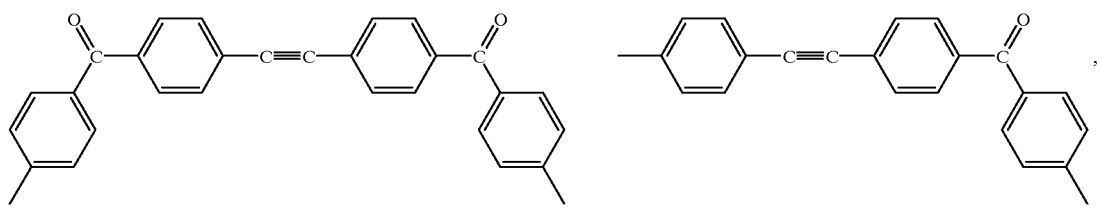
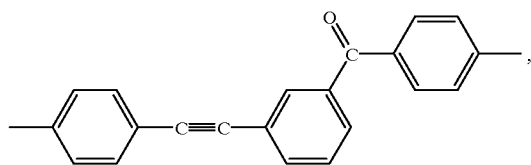
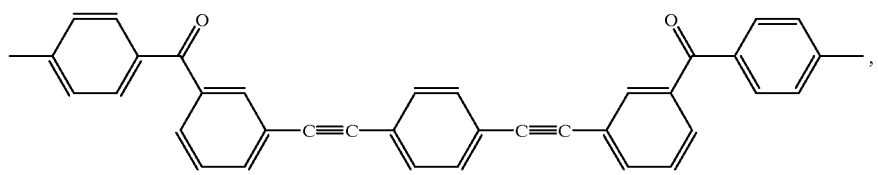
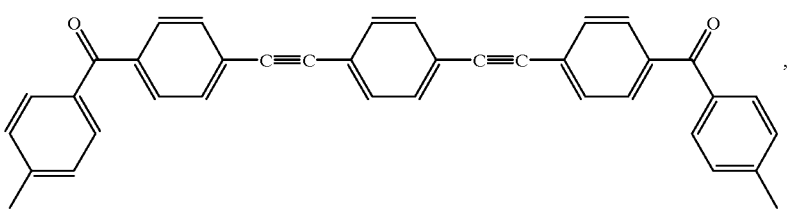

-continued

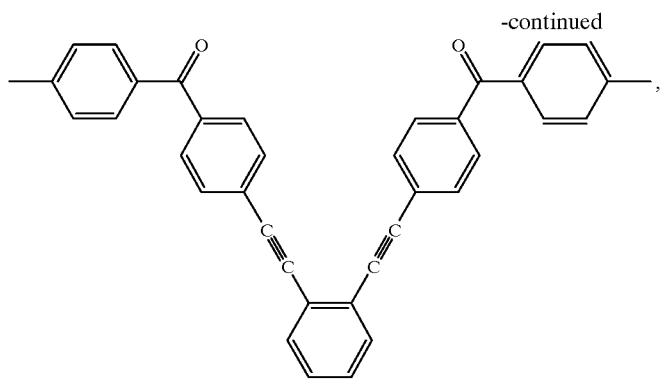

other combinations of diphenylacetylenes and benzophenones, and mixtures thereof; and the group of optional monovalent aryl radicals, EC, consisting of:

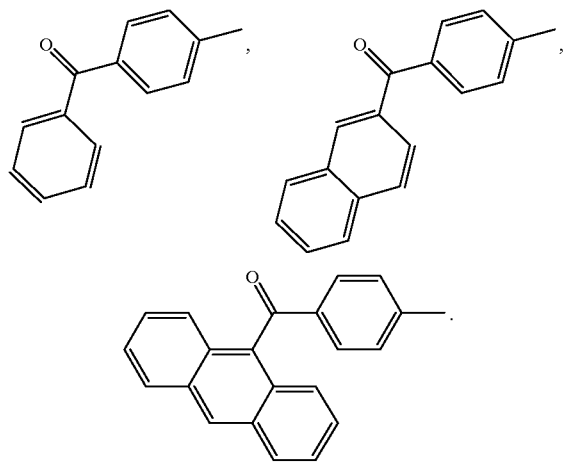

Additionally, in accordance with some embodiments of the present invention, processes for producing end-capped poly(arylene ethers) having the structure of Formula I are provided, where divalent arylene radical Y is selected from the above first group of divalent arylene radicals, divalent arylene radical Ar is selected from the above second group of divalent arylene radicals, and Z is either hydrogen, or an end-cap encompassing a methyl group or a monovalent arylene radical, EC, selected from the above group of monovalent radicals. In addition, reaction mixtures for both end-capped polymers and non end-capped polymers are provided. Thus by charging a reaction vessel with the monomers corresponding to the divalent arylene radicals Y and Ar, and a solvent; polymerizing the monomers by heating the reaction mixture for a first time to carry out azeotropic distillation where an azeotropic distillate is gradually removed, and adding to the reaction mixture a monovalent arylene radical Z and continuing to heat the reaction mixture for a second time, the end-capped polymer is formed. To provide non end-capped polymers, in accordance with the present invention, the addition of an end-capping agent is omitted and Z remains as hydrogen.

A microelectronic device, in accordance with embodiments of this invention is also provided, where a dielectric layer is disposed overlying a surface and where the dielectric layer encompasses a poly(arylene ether) having the structure of Formula I, and synthesized in accordance with the present invention.

In accordance with embodiments of the present invention, the poly(arylene ethers) of the present invention encompass a number of different polymer designs. These polymer designs include, in some embodiments, a variety of end-capped homopolymers. Some embodiments in accordance with the present invention include methods of making poly(arylene ethers) that encompass the aforementioned number of different polymer designs. Some of the aforementioned different polymer designs, in accordance with the present invention, encompass a divalent arylene radical Y selected in combination with another divalent arylene radical Ar to provide specific characteristics to the poly(arylene ethers) formed therefrom. Some embodiments of the present invention encompass methods of making monomers to provide the aforementioned divalent arylene radicals.

In addition, some embodiments of the present invention are provided that encompass methods of forming a dielectric material. In some embodiments the dielectric material is formed as a film on a substrate, for example a semiconductor substrate. In some embodiments, the dielectric material is formed as an encapsulant, for example in a multichip module. The dielectric material formed in accordance with embodiments of the present invention has excellent thermal stability as characterized, among other things, by a high glass transition temperature and little or no out-gassing. In embodiments where the dielectric material is formed as a film, it is an excellent dielectric layer for a multilevel metal structure in a microelectronic device, for example an integrated circuit or a multichip module. The dielectric layer so formed is characterized by, among other things, excellent thermal stability, a high degree of planarization, a low dielectric constant and excellent gap-fill capability.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Poly(arylene ethers) in accordance with the present invention have a general Formula I:

Formula I where the number of repeat units is n=1 to 200; Y and Ar are each a divalent arylene radical and Z is optionally, a methyl group or a monovalent aryl radical. In addition, poly(arylene ethers), in accordance with the present invention, are essentially free in final form of reactive carbon to fluorine bonds. Thus the poly(arylene ethers) of the present invention are homopolymers consisting essentially of a single segmented structure of the above repeat unit. In some embodiments, the single segmented structure encompasses an end-cap Z, while in other embodiments Z is hydrogen. In some embodiments of the present invention it has been found advantageous for the polymer of Formula I to have a number of repeat units between approximately n=5 to 60. And in still other embodiments it is even more advantageous to have the number of repeat units between approximately n=10 to 50.

Divalent arylene radical Y is derived from hydroxy-substituted aromatic ("bisphenol") compounds of a general Formula II:

HO—Y—OH         Formula II where Y is an aromatic moiety that in combination with Ar imparts, among other things, a high thermal stability and a high Tg to the final polymer. Such materials are either commercially available and/or are readily synthesized by one skilled in the art. For example, 9,9'-bis(4-hydroxyphenyl)fluorene (fluorene bisphenol) is commercially available from Nippon Steel, Tokyo, Japan. In addition, the synthesis of several bisphenol compounds is described in P. W. Morgan, *Macromolecules*, Vol. 3, p. 536 (1970) and U.S. Pat. No. 5,248,838 issued to Massirio et al. Additionally, an example of the synthesis of some compounds of Formula II is provided hereinafter. Examples of suitable groups for Y include, but are not limited to:

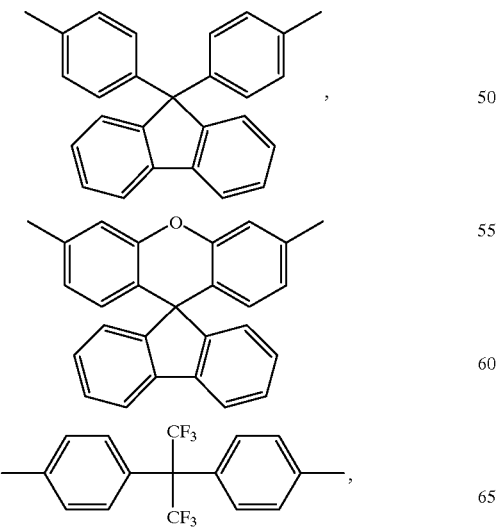

-continued

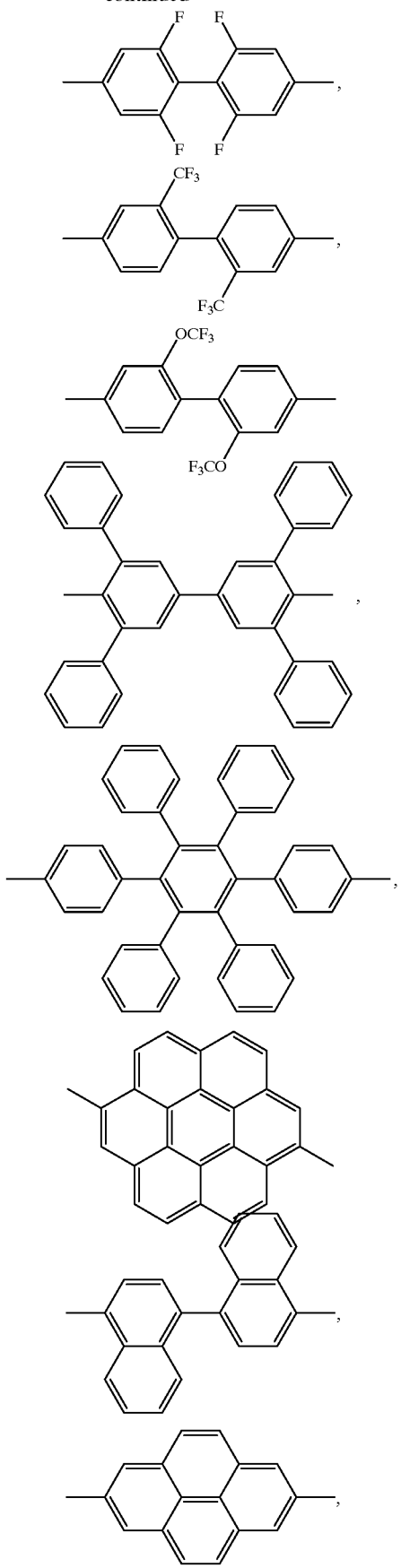

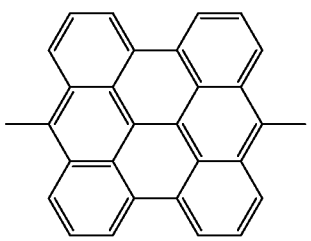

,

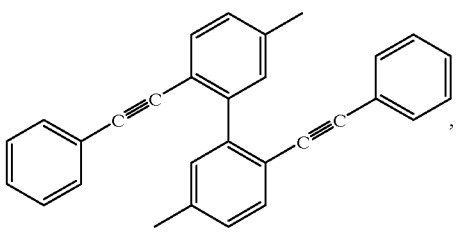

,

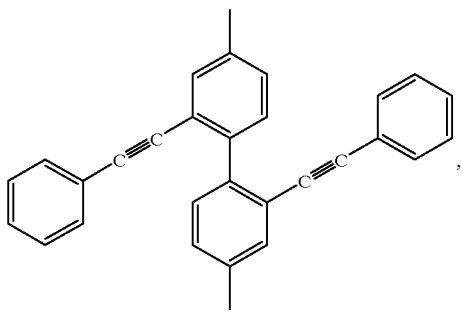

,

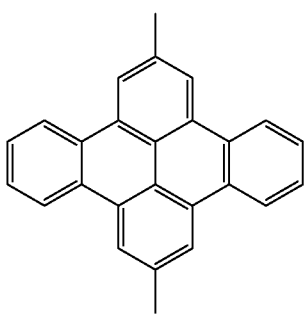

and where the following bisphenol compounds, in accordance with Formula II, have been found particularly advantageous:

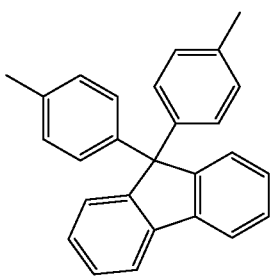

and

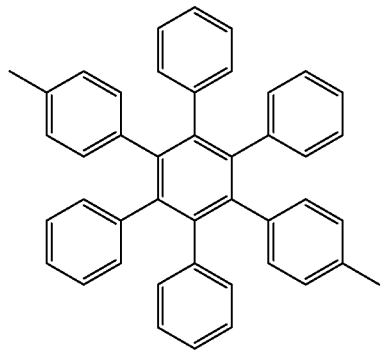

Figure 1:
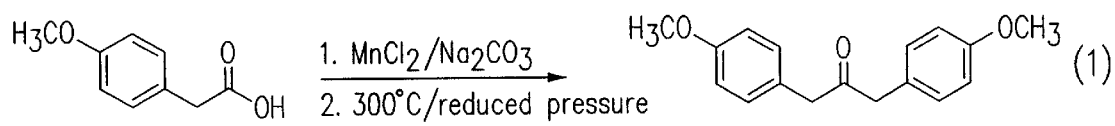
FIG. 1 illustrates a synthetic route for the preparation of 4,4'-dihydroxysexiphenylene in accordance with an embodiment of the present invention.
Figure 1:
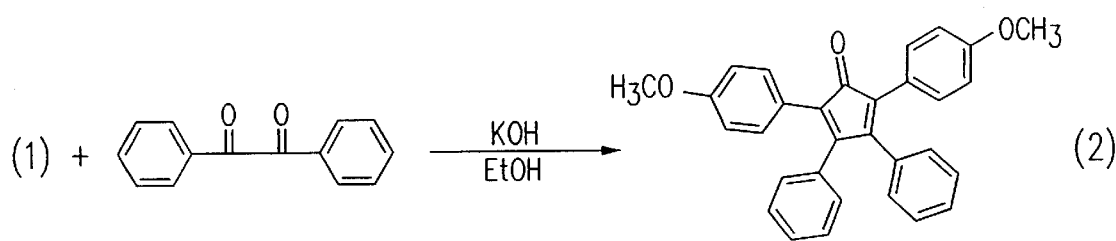
Figure 1:
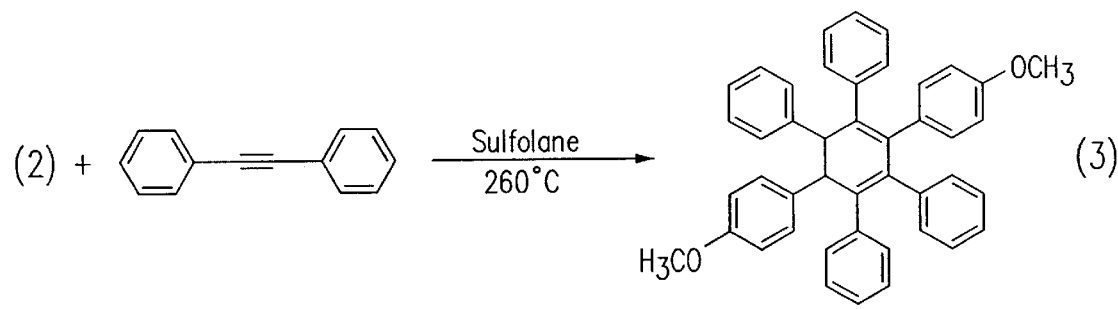

Turning now to FIG. 1, a four step synthetic route for the preparation of α,δ-bis(4-hydroxy)sexiphenylene, in accordance with an embodiment of the present invention, is presented. Thus in a first step, a first solution is prepared by adding an appropriate amount of 4-methoxyphenylacetic acid to an aqueous solution of sodium carbonate. To this first solution is added an appropriate amount of a second solution, aqueous manganese chloride, to produce a pink foamy mixture. This mixture is washed with water and filtered to yield a pink powder, now comprising sodium phenylacetate and manganese dichloride hydrate. This pink powder is distilled at 300–320° C. under vacuum to effect a thermally induced dehydrative coupling reaction to give an excellent yield (72%) of white crystals of 1,3-bis(4-methoxyphenyl)propanone, having a melting point of between approximately 75–76° C.

Equivalent weights of benzil and the 1,3-bis(4-methoxyphenyl)propanone prepared in the first step are dissolved in, for example, alcohol and heated to incipient boiling. A condensation reaction is initiated by the addition of a small amount of an aqueous potassium hydroxide solution. The solution is heated at reflux to form a purple-black slurry which on purification results in an excellent yield (91%) of purple-colored crystalline 2,5-bis(4-methoxyphenyl)-3,4-diphenylcyclopentadienone, or α,α'-bis(4-methoxy)-tetracyclone, melting at approximately 186–188° C.

To an appropriate amount of the α,α'-bis(4-methoxy)-tetracyclone, obtained from the second step, is added a slight excess of diphenylacetylene dissolved in sulfolane. The purple-colored mixture is heated, with stirring, to approximately 260–270° C. for two hours, during which time the mixture becomes light yellow-brown in color. After cooling to ambient temperature, the solution is poured into water. An excellent yield (97%)of white crystalline α,δ-bis(4-methoxy)sexiphenylene melting at 328–330° C. is obtained after purification.

An appropriate amount of the α, δ-bis(4-methoxy)sexiphenylene, obtained from the third step, is dissolved in methylene chloride and cooled to approximately −78° C. An excess of boron tribromide, dissolved in methylene chloride, is added and the reaction mixture allowed to warm to ambient with stirring over a period of approximately 12 hours. The reaction mixture is poured into an appropriate amount of water, the methylene chloride removed and crude αδ-bis(4-hydroxy)sexiphenylene isolated by filtration. After purification, a good yield (87%) of pure product, having a melting point of 447–449° C. is obtained as white crystals.

Divalent arylene radical Ar is derived from difluoroaromatics having combinations of diarylacetylenes and benzophenone segments of a general Formula III:

 Formula III and where Ar is the aromatic segment that imparts, among other things, high temperature stability and a high Tg to the final polymer. Some compounds of Formula III can be readily synthesized by one of ordinary skill in the art without undue experimentation. Details of reactions useful in the synthesis of these compounds are found in, for example, M. Paventi, E. Elce, R. J. Jackman, and A. S. Hay, Tetrahedron Letters, 33(43), 6405–6406 (1992); M. Yang, X. Huang, H. Wang, Z. Yu, Y. Zhou, and J. Pan, Zhongguo Jiguang, 19(8), 593–7 (1992); A. Bader, and D. Arlt, U.S. Pat. No. 5,185,454 (930209); Chem Abstr 93, 10635 (1993) and U.S. Pat. No. 5,233,046 issued to Hay et al. However, synthesis methods have not previously been disclosed for some other of the compounds of Formula III. Examples of the synthesis of some compounds of Formula III are provided hereinafter. Examples of divalent radicals derived from suitable difluoro compounds of general Formula III include, but are not limited to:

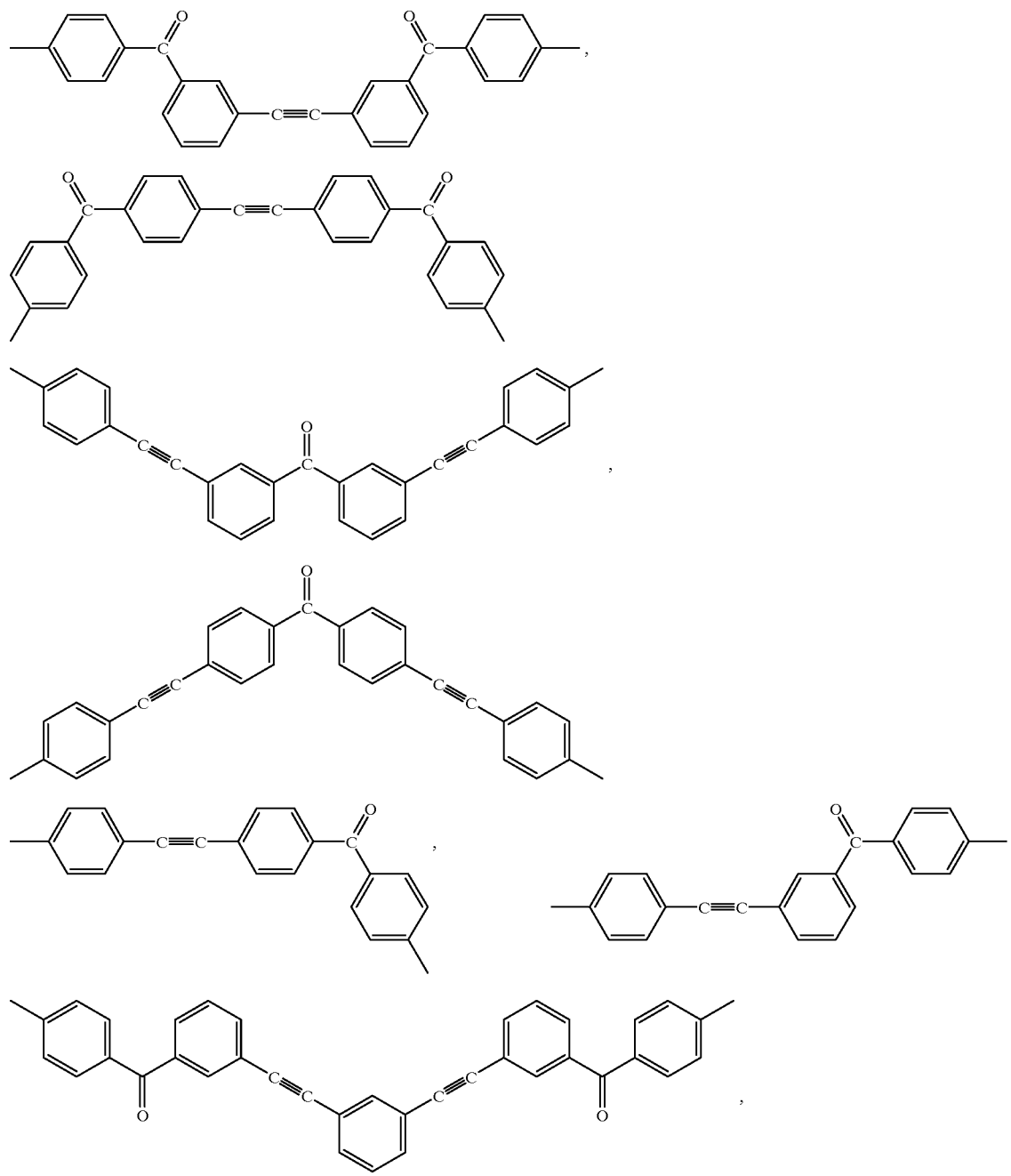

Figure 2A:
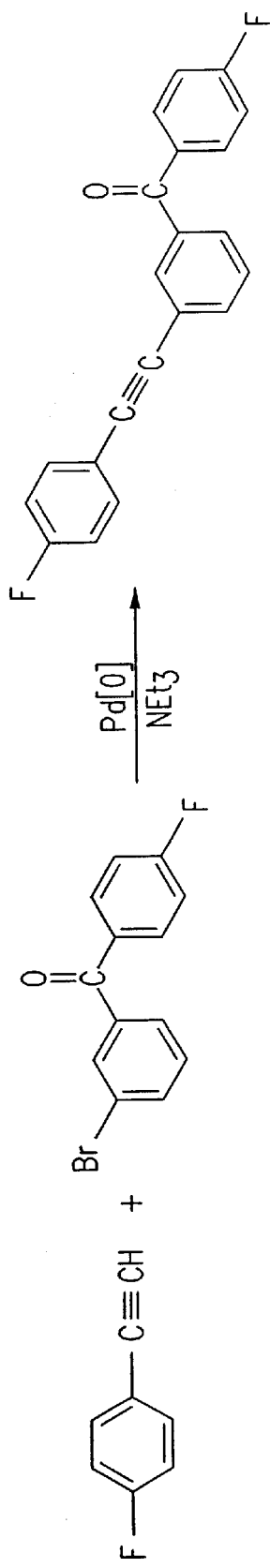
FIGS. 2A and 2B illustrate synthetic routes for the preparation of 4-fluoro-3'-(4-fluorobenzoyl)tolane and 3,3'-bis(4-fluorobenzoyl)tolane, respectively, in accordance with embodiments of the present invention.

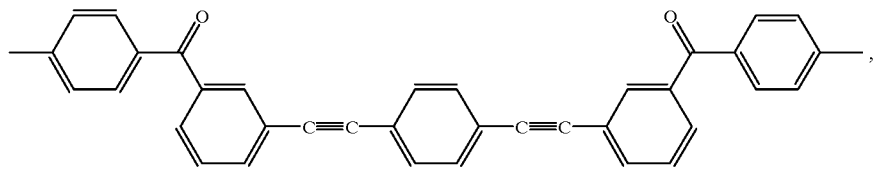
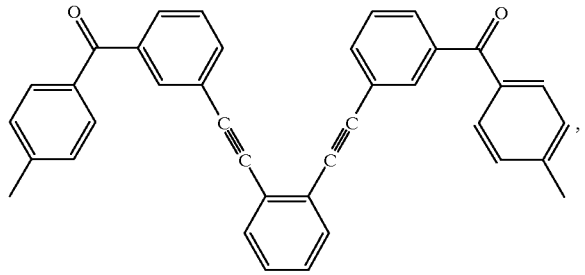
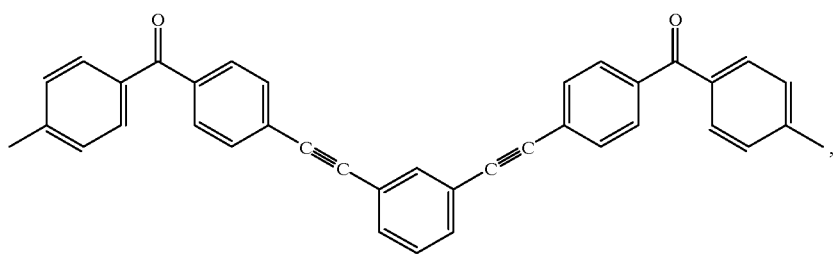
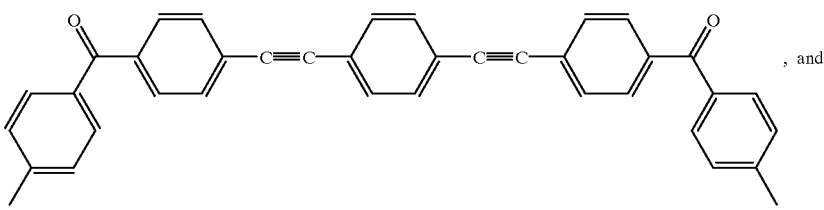
, and
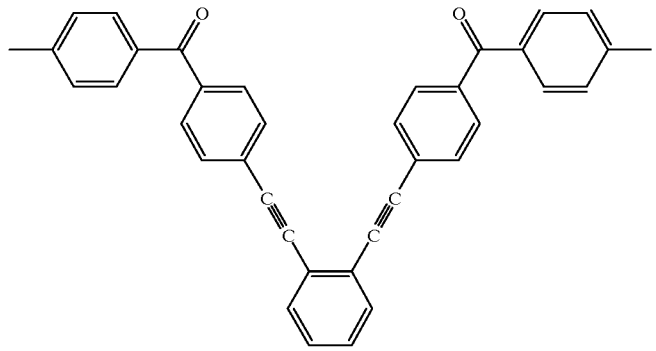
and where the following difluoro compounds, in accordance with Formula III, have been found particularly advantageous:
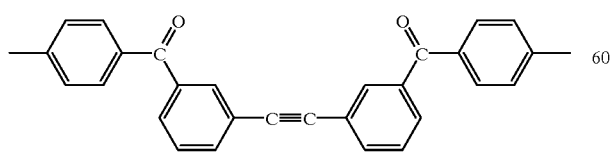
and
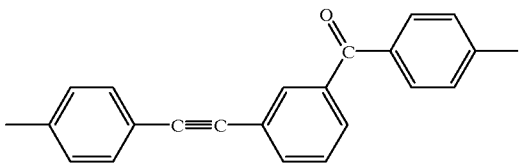
Referring now to FIG. 2A, a synthetic route for the preparation of 4-fluoro-3'-(4-fluorobenzoyl)tolane in accordance with embodiments of the present invention is shown.

Thus a reaction mixture is formed by dissolving appropriate amounts of 1-ethynyl-4-fluorobenzene, 3-bromo-4'-fluorobenzophenone, and tetrakis(triphenylphosphine)palladium[0] in a de-aerated aprotic solvent, for example, triethylamine. Alternatively, toluene can be used as a first solvent and triethylamine added as a cosolvent in a stoichiometric equivalent to 3-bromo-4'-fluorobenzophenone. The reaction mixture is heated to 80° C. with stirring under an inert atmosphere, e.g. argon, for approximately three hours. The reaction mixture is then allowed to cool to ambient while stirring is continued for approximately 16 hours. A white precipitate of triethylamine hydrobromide is removed by filtration and the aprotic solvents employed are removed by evaporation. The resulting solids are dissolved in a solvent, e.g. dichloromethane, or preferably toluene due to its relatively higher environmental friendliness, and then washed with water, an aqueous 2% HCl solution, brine, and then dried. After solvent evaporation, a good yield of white crystalline 4-fluoro-3'-(4-fluorobenzoyl)tolane, melting at approximately 127–128° C. is obtained. Purification by recrystallization from acetone results in a material with a melting point of 130–131° C. Alternatively, recrystallization from toluene provide a crystalline material in the form of rhombic fine needles with a melting point of 135–136° C.

Figure 2B:
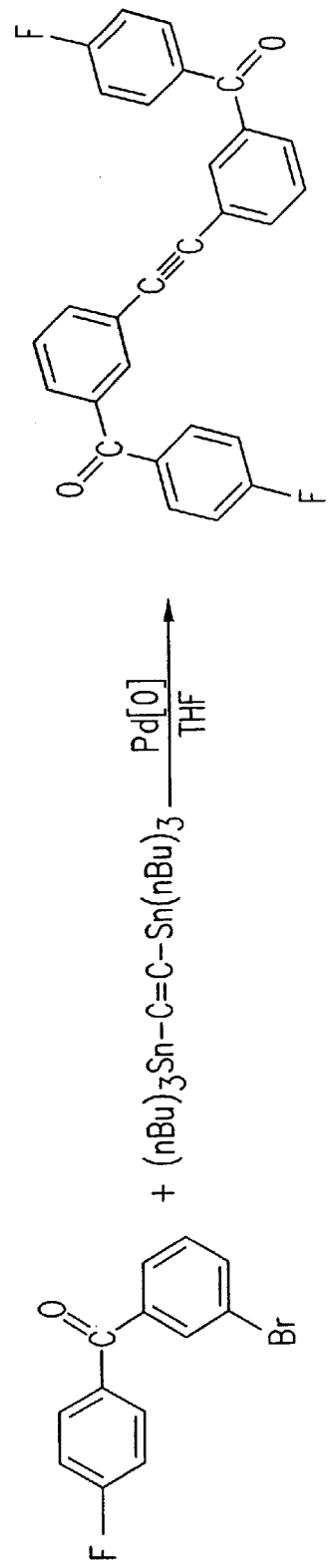

Turning now to FIG. 2B a synthetic route for the preparation of 3,3'-bis(4-fluorobenzoyl)tolane in accordance with embodiments of the present invention is illustrated.

To a first solution of appropriate amounts of 3-bromo-4'-fluorobenzophenone and tetrakis(triphenylphosphine)palladium[0] dissolved in an appropriate solvent, e.g. tetrahydrofuran (THF), an appropriate amount of a second solution of bis(tri-n-butylstannyl)acetylene is added dropwise with stirring. Typically the same solvent is employed for both the first and second solutions. The reaction mixture formed is then heated at reflux for approximately 24 hours under an inert atmosphere, e.g. argon. During reflux, off-white crystals of product are gradually formed. The isolated off-white solid is recrystallized to yield white crystals of 3,3'-bis(4-fluorobenzoyl)tolane in 66% yield having a melting point of approximately 205–206° C.

Z is hydrogen or an end-cap encompassing a methyl group or a monovalent arylene radical derived from fluoro substitutes aromatic compounds of a general Formula IV:

Z—F  Formula IV where Z is an aromatic moiety that imparts, among other things, enhanced stability and a reduction in trace metal contamination in the polymer. Such materials are either commercially available; for example 4-fluorobenzophenone is available from Aldrich Chemical Co., Milwaukee, Wis., Lancaster-PCR, Windham, N.H., Oakwood Chemical, Salisbury, S.C., or Riedel de Haën, Seelze, Germany; and/or are readily synthesized by one skilled in the art.

Examples of suitable monofluoro compounds of general Formula IV include, but are not limited to:

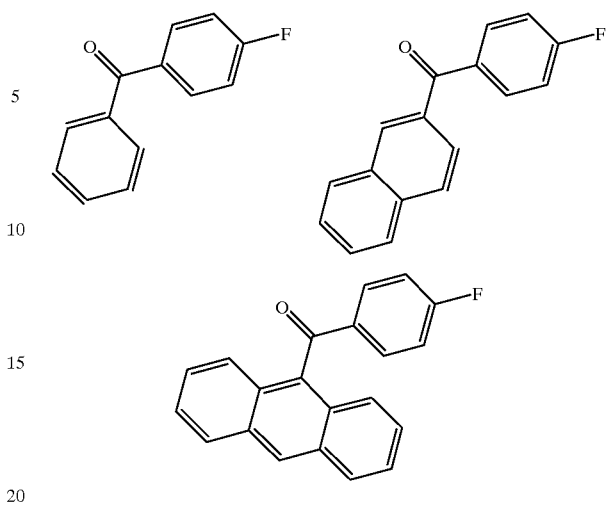

Where Z is a methyl group, it is conveniently derived from methyl chloride, methyl bromide, or methyl iodide. However, methyl chloride is most advantageous, due mainly to its easy handling and availability both as a pressurized gas or as a solution in ethyl ether.

Figure 3:
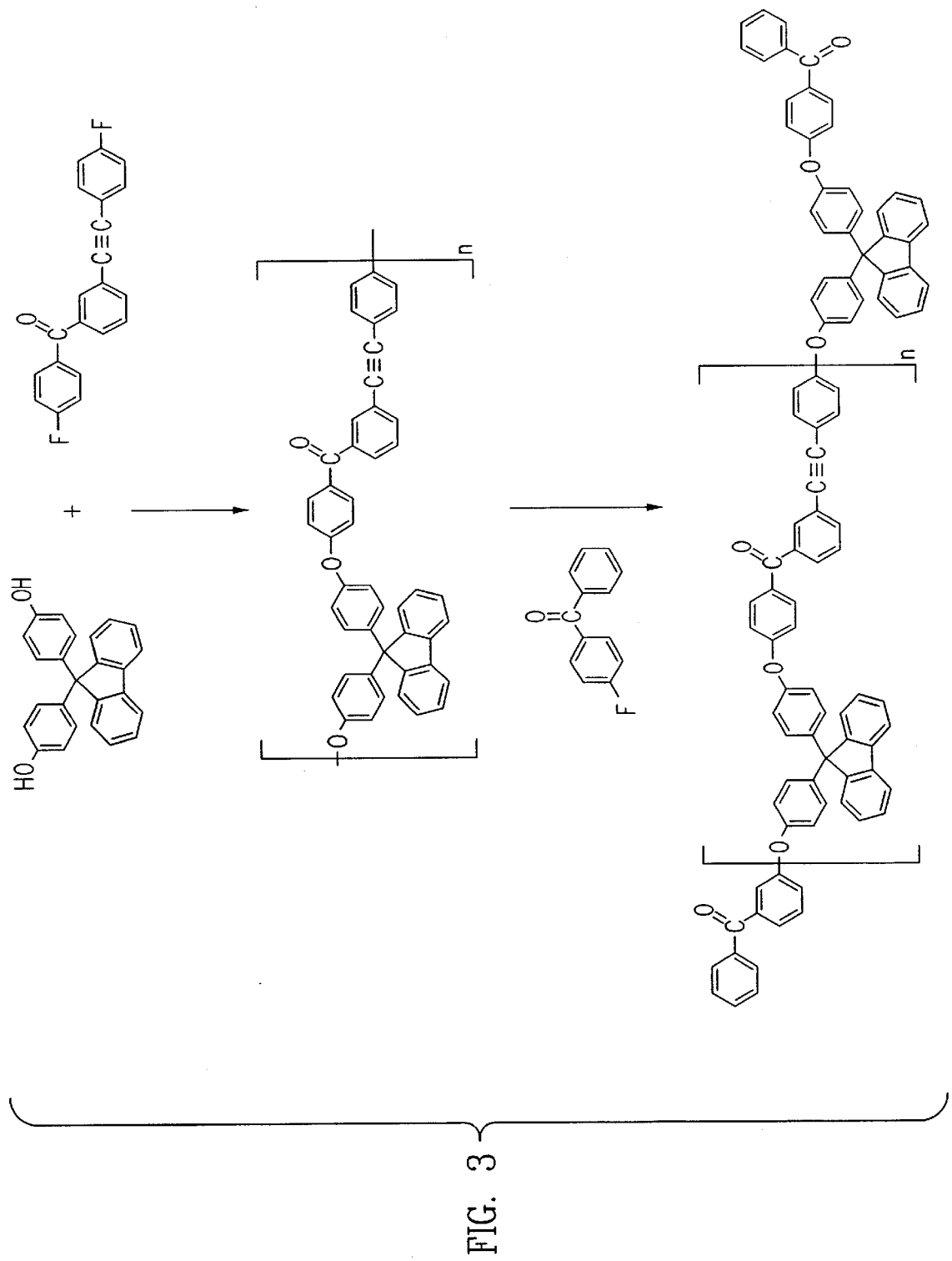
FIG. 3 illustrates a synthesis of an end-capped polymer in accordance with an embodiment of the present invention.

Looking now to FIG. 3, a synthesis of a poly(arylene ether) of Formula I is shown. Generally an equivalent of a bisphenol compound, Y of Formula II, is combined with an equivalent of a difluoro compound, Ar of Formula III, in an appropriate solvent, e.g. sulfolane, and in the presence of potassium carbonate, and a condensation-coupling reaction allowed to proceed during a first time. The coupling of these compounds advantageously results in a homopolymer that forms the backbone of the poly(arylene ether) of Formula I.

Thus an appropriately sized reaction vessel, equipped with for example, stirring, a reflux condenser, an appropriate azeotropic distillation trap, e.g. a Dean-Stark trap, and a thermocouple, is provided. The reaction vessel contains a sufficient quantity of a first solvent, e.g. N-methyl-2-pyrrolidinone (NMP), N,N-dimethylacetamide (DMAC) or sulfolane, maintained at an appropriate temperature, e.g. 80–100° C. The reaction vessel, is then charged with an appropriate amount of a compound of Formula II, and an appropriate amount of a compound of Formula III. To this mixture, an appropriate amount of an anhydrous carbonate (e.g. potassium carbonate) is added, and the mixture washed with appropriate amounts of the first solvent and, where desired, an optional second solvent, e.g. benzene or toluene. Advantageously, where the first solvent is sulfolane, a desirable second solvent is toluene. The reaction mixture is heated to begin azeotropic distillation. Thus for a sulfolane/toluene solvent system, the azeotropic distillate will first be the toluene/water azeotrope. The azeotropic distillation is continued for a first time to completely remove all traces of water present in the solvents and the water initially formed in the reaction. The temperature is then advantageously increased by removal of the distillate of the second solvent until 175° C. at which point the temperature is maintained for an appropriate period of time to yield a crude polymer of Formula I.

In some embodiments of the present invention the crude polymer is end-capped. Thus where a monovalent arylene radical is employed as an end-cap, an appropriate amount of a compound of Formula IV is added to the reaction mixture containing the crude polymer and the mixture is heated for a second time. Where a methyl group is employed as an end-cap, methyl chloride gas is bubbled through the reaction mixture containing the crude polymer and the mixture is not heated for a second time.

It should be noted that azeotropic distillation is advantageously used, among other things, to provide a mechanism of water removal to give an anhydrous reaction mixture before reaching a sufficiently high temperature to promote polymerization. After polymerization, the hot reaction mixture is diluted with an appropriate aprotic solvent, e.g. N-methylpyrrolidinone (NMP), filtered hot, or after returning to ambient temperature, and precipitated in an excess of, for example, methanol. The precipitate is isolated, washed and dried to constant weight to provide a pure poly(arylene ether), typically in excess of 95%.

For one advantageous embodiment of the present invention, n is between 10 and 50, HO—Y—OH is 9,9'-bis(4-hydroxyphenyl)fluorene, F—Ar—F is 4-fluoro-3'-(4-fluorobenzoyl)tolane and Z—F is 4-fluorobenzophenone. In another desirable embodiment, n is between 10 and 50, HO—Y—OH is 9,9'-bis(4-hydroxyphenyl)fluorene, F—Ar—F is 3,3'-bis(4-fluorobenzoyl)tolane and Z is hydrogen. And in yet another useful embodiment of the present invention, n is between 10 and 50, HO—Y—OH is $\alpha,\delta$-bis(4-hydroxy)sexiphenylene, F—Ar—F is 4-fluoro-3'-(4-fluorobenzoyl)tolane and Z is hydrogen.

Poly(arylene ether) compositions of the present invention are used as layers, coatings or encapsulants, and substrates for microelectronic devices, for example, integrated circuits (ICs), printed circuit boards (PCBs), microelectronic modules (MEMs) and the like. Generally, polymers in accordance with the present invention are used as dielectric or insulating layers; however, the polymers also provide mechanical strength. Thus, poly(arylene ethers) in accordance with the present invention are disposed between layers of conductive paths or as a passivation layer overlying a layer of conductive paths in ICs, PCBs and MEMs.

Some embodiments of poly(arylene ethers) in accordance with the present invention are used as interlayer dielectrics between one or more metal layers in ICs having multilayer metal structures. In addition, such interlayer dielectrics that encompass embodiments of the present invention, advantageously provide electrical isolation between adjacent conductive paths. As previously mentioned, current IC devices often have device geometries as small as 0.25 $\mu$m or smaller. The next generation of IC devices may have geometries of 0.18 $\mu$m or smaller. Typically these small geometries result in spaces between structures, gaps, that are also as small as the smallest device geometry employed. Thus, for a material to electrically isolate adjacent conductive paths from one another in the conventional subtractive aluminum technology, the material should fill these spaces or gaps between the adjacent conductive paths.

Where a CVD silicon oxide dielectric is used, often specially designed equipment and/or processes need be used to fill these small gaps. Advantageously, embodiments of the present invention are designed to have good gap-filling characteristics, alleviating the need for such special equipment and/or processes. It has been unexpectedly found that incorporation of various combinations of divalent aromatic radicals derived from benzophenones and diphenylacetylenes, as structural components of poly (arylene ethers), as previously described with respect to Ar, provide gap-filling capability for 0.25 $\mu$m or smaller gaps.

IC devices having multilayer metal structures often employ a tungsten (W) plug process for interconnection between adjacent layers of metal paths. Typically, such W plugs are formed using chemical vapor deposition techniques that require a heating the semiconductor substrate to approximately 430° C. Thus, where an organic dielectric is employed for the interlayer dielectric material, it should retain its integrity at such temperatures. Advantageously, embodiments in accordance with the present invention are designed to have excellent thermal stability and a high Tg. It has been found that incorporation of divalent radicals, especially those derived from combining diphenylacetylenes and benzophenones, provide such thermal stability and Tg. Embodiments of the present invention have Tg's in excess of 350° C. and some embodiments have Tg's in excess of 400° C. In addition, these embodiments of the present invention have high retention of storage modulus, low dielectric constant and excellent gap-filling capability.

It has also been found that incorporation of flexible moieties, such as ether linkages between adjacent radicals, and carbonyl groups within the radicals themselves, both provide flexibility to the resulting poly(arylene ether). In addition, such ether and carbonyl moieties provide coupling sites that result in excellent adhesion to typical semiconductor surfaces, e.g. comprising silicon, silicon oxide, aluminum, copper, and the like. Thus embodiments in accordance with the present invention do not require adhesion promoters for interfacial adhesion; and the polymer films formed in accordance with the present invention maintain excellent adhesion to typical semiconductor surfaces after periods of immersion in hot water and common photoresist stripper and post-etch cleaning solutions as shown in Table 2 below.

It has also advantageously been found that the above described flexible moieties additionally provide for unexpectedly low viscosities and enhanced flow characteristics, in contrast to other organic dielectrics such as polyimides which have high solution viscosities. Thus, embodiments of the present invention provide excellent planarization capability for IC devices. Often, additional planarization technique need be employed, for example, chemical mechanical polishing (CMP). Where such CMP polishing is desired, for example, in conventional subtractive aluminum process and the alternative damascene/dual damascene processing, embodiments of the present invention provide the hardness necessary to enable such CMP processes. More importantly, embodiments of the present invention also provide sufficient adhesive strength (materials-to-substrate and material-to-cap adhesion) to allow available CMP processes to be used conveniently. Those organic film materials, which may not posses equivalent hardness and adhesive strength to embodiments of this invention, would require additional CMP process design to experiment with greatly reduced down force, the beneficial effect of which are yet to be proven.

The advantages of embodiments of the present invention are evidenced by, among other things, the excellent thermal behavior exhibited. It is seen that the weight loss of typical poly(arylene ether) films, in accordance with the present invention, is about 0.5–1.0 percent per hour (%/hr) at 450° C.

Films or layers of poly(arylene ether) polymers, prepared in accordance with embodiments of the present invention, exhibit negligible hysteresis during thermal cycling between 25 to 450° C, demonstrating the film's stability during thermal cycling toward stress delamination and its thermal stability.

Solutions of poly(arylene ether) compositions in accordance with embodiments of the present invention are typically used to coat integrated circuits formed on/in a semiconductor substrate or wafer. Typically the solution encompasses one or more of the poly(arylene ether) compositions of the present invention and is applied to the wafer using a spin-coating process. However, other appropriate coating processes, for example spraying, can also be employed.

Solvents suitable for use in such solutions of poly(arylene ethers) of the present invention include aprotic solvents, for example cyclic ketones such as cyclopentanone, cyclohexanone, cycloheptanone, and cyclooctanone; cyclic amides such as N-alkylpyrrolidinone wherein the alkyl has from about 1 to 4 carbons atoms and N-cyclohexyl-pyrrolidinone and mixtures thereof. Solutions using cyclohexanone are believed to be the most advantageous cyclic ketone.

A cyclohexanone solution of the present invention is formed by combining cyclohexanone solvent, of suitable low-metals electronic grade, and poly(arylene ether) composition under ambient conditions in any conventional apparatus having a non-metallic lining. Preferably, a glass-lined apparatus is employed. The resulting solution is comprised of, based upon the total weight of the solution, from about 1 to about 50%, and preferably from about 3% to about 20% of the poly(arylene ether) composition and from about 50% to about 99%, and preferably from about 80% to about 97% of solvent.

The resulting solution is then filtered under ambient conditions via any of the filtration devices well known in the art including, but not limited to commercially available filtration cartridges having the desired porosity. Preferably, these filtration cartridges consist of a non-stick, scratch resistant material such as Teflon® available from DuPont. Although one skilled in the art can readily determine without undue experimentation the ultimate pore size of the filtration device based upon the desired application, it is generally preferable to use a filtration device having a pore size less than about 1.0 $\mu$m, and preferably less than 0.1 $\mu$m.

In some embodiments of the present invention, the mixed solution is filtered through a variety of filtration means having different pore sizes. In some embodiments, this variety of filtration means encompass sequential filtration through about 4 filtration means of decreasing pore size, the final pore size being approximately 0.1 $\mu$m or less. Such filtered solutions are then used to coat substrates, for example semiconductor wafers using, for example, spin-coating techniques.

As one of ordinary skill in the art knows, semiconductor substrates are currently available in a variety of sizes ranging from as small as three or four inches in diameter to as large as twelve inches in diameter. Therefore, it will be understood that the process parameters presented hereinafter for an 8 inch wafer are for illustrative purposes only. Modifications to the volume of material, solution concentration, viscosity, rotational speeds or the various times presented can be made for other specific applications. It will be understood that all such modifications are meant to be within the scope and spirit of the present invention.

As previously mentioned, embodiments of the present invention typically employ spin coating techniques for application of the film of the poly(arylene ether). Preferably a solution of approximately 15% of the polymer (by weight) in cyclohexanone, or other appropriate solvent, prepared in the manner previously described, is dispensed onto a wafer at or near the center of the wafer. In some embodiments, the wafer will remain stationary during the dispense cycle, while in some embodiments the wafer will turn, or spin, at a relatively low speed, typically less than about 100 revolutions per minute (rpm). The wafer is then spun, or the speed of rotation increased, typically to about 500 rpm, to uniformly spread the polymer across the surface of the wafer. In some embodiments of the present invention, the spread portion of the coating cycle is followed by a short rest period where wafer rotation is halted. Typically, the rest period, or spread period where no rest period is used, is followed by a thickness spin at a high rotational speed, typically about 2000 rpm. That is to say a portion of the cycle where the wafer's rotational speed and the time at that speed is adjusted to obtain a predetermined polymer layer thickness. Typical spin coat processes, suitable for an enhanced gapfill application and a Damascene application and including solvent removal and polymer cure steps are illustrated in Tables 1a and 1b for 8 inch wafers.

TABLE 1a

Standard Process

| Time (sec.) | Speed (rpm) | Step ID |
|---|---|---|
| 3.0 | 0 | Dispense |
| 5.0 | 500 | Spread Spin |
| 5.0 | 0 | Hold |
| 60.0 | 2000 | Thickness Spin |

TABLE 1b

Damascene Process

| Time (sec.) | Speed (rpm) | Step ID |
|---|---|---|
| 3.0 | 0 | Dispense |
| 60.0 | 2000 | Thickness Spin |

Once the coating process as described above, or as modified for any other specific application, is completed, the coated substrate is heated to effect a cure process. Any conventional apparatus known in the art can be employed for heating the coated wafer. Preferably, the apparatus for heating the wafer is an integral part of a spin coating apparatus used for coating the wafer, although a separate apparatus for curing coatings applied in accordance with embodiments of the present invention are also suitable. One commonly employed heating apparatus employs one or more "hot plates" to heat the wafer. This type of heating not only rapidly and directly expels the solvent from the solution and causes the film to flow, but is also easily adaptable for continuous processing operations. The coated substrate is typically heated for about 30 seconds (sec) to about 5.0 minutes (min) at temperatures ranging between about 50° C. and about 250° C., and more preferably about 100° C. and about 200° C. Multiple hot plates, e.g. between about 2 and about 5, and preferably from about 2 to about 3, can be used to process the coated substrates under similar conditions.

In some embodiments, coated substrates are heated for up to about 120 sec, and preferably from about 50 to about 70 sec, on a hot plate set at a temperature of about 70° C. to about 150° C., and preferably from about 100° C. to about 150° C. A final cure cycle is preferably employed to complete the curing of the film applied. This final cure cycle can employ a conventional thermal curing apparatus, for example an oven chamber with a temperature range of about 300° C. to about 450° C., and preferably from about 375° C. to about 425° C., for about 0.5 to about 4 hours (hr), and preferably from about 1.0 to about 2.0 hr. In some embodiments a cure pressure ranging between about 1 torr to about 2 torr is employed in addition to thermal energy. In some embodiments of the present invention an electron beam heating apparatus, as described in U.S. Pat. No. 5,003,178 issued to Livesay, et al., is employed to heat the coated substrate.

The thickness of the resulting thin-film ranges from about 0.2 μm to about 40 μm and preferably from about 0.6 μm to about 2.0 μm. The films produced by the standard process of this invention generally exhibit a thickness standard deviation less than 1%, and often less than 0.5% of the average film thickness. In addition, the dielectric films of the present invention exhibit excellent gap-filling capability, filling gaps or spaces between adjacent conductive paths of 0.25 μm or less. The dielectric films of the present invention also exhibit superior planarization of typical semiconductor surfaces, where planarization of 85% or more is advantageously achieved.

In some embodiments of the present invention, a layer of silicon oxide is employed in conjunction with dielectric films formed as described above. Where such silicon oxide films are used, the silicon oxide film is generally formed overlying the polymer film using a chemical vapor deposition process. Such silicon oxide films typically are about 10 nanometers (nm) to 200 nm thick and preferably about 50 to 100 nm thick.

Where an overlying silicon oxide layer is employed, the silicon oxide layer is often used as a hard mask for forming a via or contact opening through the polymer layer. Thus a photoresist layer is formed and patterned over the silicon oxide film. The silicon oxide film is etched using any of the appropriate anisotropic etch methods, for example a reactive ion etch process employing a fluorinated hydrocarbon gas (e.g. trifluoromethane) and oxygen. Advantageously, the same anisotropic etch process is generally applicable to etching poly(arylene ether) polymers formed in accordance with the present invention.

As previously mentioned, polyarlyene ether polymers in accordance with the present invention can be employed in microelectronic devices other than ICs, or in ICs for purposes other than interlayer dielectrics Thus, in some embodiments, poly(arylene ether) polymers of the present invention are employed as protective or passivation layers in ICs. Such passivation layers are formed using spin coat and dry processes as described above or by what are commonly known as a blob process. That is, a blob of the dielectric material is dispensed in liquid form to overlie the IC.

Some embodiments of the present invention encompass a layer of poly(arylene ether) polymer applied in a multichip module. In multichip modules, one or more substrates having ICs or other semiconductor devices thereon are electrically coupled to one another in a single module. Films or layers of dielectric materials formed of poly(arylene ethers) of the present invention are employed as an insulative material between the several substrates. In some multichip module embodiments, poly(arylene ethers) of the present invention are employed to provide insulation between various regions within the module or to insulate and support lead-frames or other commonly employed chip carriers or interconnect devices. A variety of methods, for example screen printing, semi-cured polymer preforms and the like are employed for providing the poly(arylene ethers) of the present invention to such multichip modules, as are known.

The following characteristics encompass non-limiting measurements that illustrate the properties of the poly (arylene ether) solutions and thin films of the present invention. Table 2 demonstrates that polymer films in accordance with the present invention possesses superior thermo-mechanical and electrical properties:

1) Film Thickness (A):
Film thickness is measured using a calibrated Nanospec® AFT-Y CTS-102 model 010–180 Film Thickness Measurement System available from Nanometrics, Co. An average of measurements at five locations on a wafer are reported as the film thickness for each sample.

2) Dielectric Constant:
Dielectric constant is determined using the capacitance-voltage ("CV") measurement technique and employs a Hewlett-Packard Model 4061A semiconductor measurement system at a frequency of 1 MHz. The test procedure set forth by Lau et al. in "Characterization and Thin-Film Properties of FLARE™, A Low Dielectric Constant, High Tg Fluorinated Poly(arylene ether), as an Intermetal Dielectric for Interconnect Applications," Proceedings of Low Dielectric Constant Materials and Interconnects Workshop (California Apr. 30–May 1, 1996) is used and is incorporated herein by reference. This test procedure employs a metal-insulator-metal (MIM) structure with the thickness of each layer ranging from about 0.5 to 1 micron (μm).

3) Differential Scanning Calorimetry {"DSC"):
The Glass Phase Transition Temperature, Tg, is determined using a Perkin-Elmer Model DSC 7 by cooling a sample at a rate of 10° C./min from 450° C. to 25° C. after a dwell time of 5 minutes at 450° C.

4) Gap-fill Ability (μm):
A patterned wafer with a cured, 1 μm thick layer of a poly(arylene ether) formed thereon is cleaved to allow a cross-sectional view of the coated patterned wafer using a Scanning Electron Microscope (SEM). The reported values represent the smallest gap sizes of the wafer's pattern that are completely filled by the polymer without defects.

5) Thermal Stability:
Both the isothermal thermal gravimetric analysis ("ITGA")(microgram loss/time) and thickness change (%) were determined using the procedure set forth in Lau, K. S. Y., et al, "Characterization and Thin-Film Properties of FLARETM, A Low Dielectric Constant, High Tg Fluorinated Poly(arylene ether), as an Intermetal Dielectric for Interconnect Applications," Proceedings, Thirteenth International VLSI Multilevel Interconnection (VMIC) Conference & Poster Session (California, Jun. 18–20, 1996), incorporated herein by reference.

6) Adhesion to Surfaces:
The wafer is coated with the organic polymer dielectric solution using the appropriate spin, bake, and cure cycles. Miniature aluminium studs, supplied with an uncured epoxy coat and kept refrigerated until just before use are glued to the center of at least 15 to 25 samples per wafer made by cleaving the wafer into 2.25 cm² samples. Each stud is clamped on the wafer sample with a small vice/clip device (the tool and method are self-explanatory), assuming even and constant pressure being maintained during the curing. The fixture is then heated at 150:C for 60 minutes to cure the epoxy and then cooled to ambient temperature.

A Sebastian-5A stud-pull instrument manufactured by The Quad Group, Spokane, Wash., is used to measure the adhesion strength of the polymer film to the substrate surface. The tail of the stud is inserted into a receiving cavity in the instrument and automatically pulled upon until the system senses a break. The value recorded is expressed in kpsi (thousand pounds per square inch).

EXAMPLES

Embodiments of the present invention will be further described and understood by reference to the following working examples thereof. These examples are provided to illustrate the present invention and do not provide limits or restrictions thereto.

A. Monomers

Examples A1 and A2 describe alternate synthetic routes for the preparation of 1-ethynyl-4-fluorobenzene. The A2 route is believed better suited for scale-up to commercial quantities.

Examples A3a–A6b are directed to the synthesis of compounds corresponding to the Ar monomers of the poly (arylene ethers) of this invention.

Examples A7 and A8 are directed to the synthesis of compounds corresponding to the Y monomers of the poly (arylene ethers) of this invention.

Example A1

First Preparation of 1-ETHYNYL-4-FLUOROBENZENE

In a 1 Liter, round-bottom, three neck flask, a solution of 50 mL (0.51 Mol) ethynyltrimethylsilane, 1.5 g of palladium [II]acetate, 2.0 g of copper[I] iodide, 3.0 g of triphenylphosphine and 58 mL (0.52 Mol) of 4-bromofluorobenzene in 500 mL of de-aerated triethylamine were heated to 80° C. with stirring under an argon blanket for 2 hr. A white precipitate started to form after approximately 30 min. The reaction mixture was then cooled to 50° C. and stirred for an additional 2 h and then allowed to cool to room temperature with stirring overnight. The orange reaction mixture was filtered and a white precipitate of triethylamine hydrobromide was removed. The filtrate was concentrated by removal of the solvent. The residue was dissolved in 200 mL of dichloromethane and the resulting solution washed with water (3×150 mL), 5% HCl (3×150 mL), saturated sodium bicarbonate solution (3×150 mL), brine and then dried over sodium sulfate. After removal of the solvent, a clear oil was obtained 42.3 g (93%). The clear oil was further purified by dissolving the oil in 200 mL of methanol, to which 2 g of potassium carbonate was added with stirring. The stirring was continued overnight at ambient temperature. Upon distillation, 22.8 g, (0.19 Mol, 82%) of 1-ethynyl-4-fluorobenzene was obtained as a clear colorless liquid.

It has been observed that an appropriate amount of a palladium[0] catalyst can be used instead of the palladium [II]/copper[I] iodide catalyst system described above. Preparation of the palladium[0] catalyst is described below.

Example A2

Second Preparation of 1-ETHYNYL-4-FLUOROBENZENE

1-Bromo-4-fluorobenzene (791.2 g, 4.5 Mol), ethynyltrimethylsilane (500 g, 5.09 Mol), 10 g of dichlorobis (triphenylphosphine)palladium[II] catalyst, 700 mL of anhydrous triethylamine, 8 g of copper[I] iodide, and 12 g of triphenylphosphine were placed into a $N_2$ purged, 5-Liter 4-neck round-bottom flask, equipped with an overhead mechanical stirrer, condenser, and positioned inside a heating mantle.

The mixture was heated to a gentle reflux (about 88° C.) and maintained at reflux for 7 hours. The reaction mixture became a thick black paste and was cooled. Gas chromatographic analysis indicated complete conversion of starting material 1-bromo-4-fluorobenzene. The solids were filtered and washed with ether. The ether solution was extracted twice with 300 mL of water and dried over anhydrous sodium sulfate. After filtering off the sodium sulfate, the filtrate was evaporated on a rotary evaporator to give 1650 g of a crude solid. The material was distilled in the Kugelrohr with the receiver flask in a dry ice/acetone bath. 1432 g were recovered. 82% yield.

A 12-Liter 3-neck round-bottom flask equipped with a nitrogen inlet, an overhead mechanical stirrer, was charged with 6 Liters of methanol, the 1-fluoro-4-(trimethylsilyl) ethynylbenzene (1432 g) prepared above, and 98 g of anhydrous potassium carbonate. Stirring was continued until no starting material was detected by gas chromatographic analysis (about 1 hour).

The reaction mixture was then filtered into a one-neck flask and cold-distilled under reduced pressure supplied by a water aspirator. The product remained in the flask while methanol was collected in a receiver chilled in a dry ice/acetone bath (−78° C.). A dry ice/acetone trap was also placed in the vacuum line. The contents of the receiver were redistilled and this process was repeated several times until the contents of the receiver showed a negligible amount of product. A total of 720 g of the desired product, 1-ethynyl-4-fluorobenzene, was collected.

Example A3a

Preparation of 4,4'-BIS(4-FLUOROBENZOYL) TOLANE

The monomer 4,4'-bis(4-fluorobenzoyl)tolane, (or alternatively denoted 4,4'-bis(4-fluorobenzoyl) diphenylacetylene) is prepared from the Friedel-Crafts acylation of diphenylacetylene with 4-fluorobenzoyl chloride according to the following process.

To a 100 mL, 3-neck, round-bottom flask equipped with a magnetic stirrer, a thermocouple, and a condenser were placed 2.67 g (15.0 mMol) of diphenylacetylene, 5.00 g (31.5 mMol) of 4-fluorobenzoyl chloride, and 50 mL of dichloromethane. Anhydrous aluminum chloride (7.34 g, 55.0 mMol) was added slowly with stirring. The reaction mixture was heated at reflux overnight (16 hr) with stirring, then quenched by pouring it into a mixture of ice and dilute HCl. The solution was extracted with dichloromethane (3×25 mL). The resulting solution was washed with water (2×30 mL), saturated sodium bicarbonate solution (2×30 mL), brine, and then dried over sodium sulfate. After removal of the solvent, the product was purified by silica gel column chromatography, using 1:1 dichloromethane-hexanes as the elutant, in the yield of 42%. After removing the solvent, white crystals with a melting point of 249–250° C. were obtained.

Example A3b

Alternate Preparation of 4,4'-BIS(4-FLUOROBENZOYL)TOLANE

Alternately, an organotin catalyst can be used to prepare 4,4'-bis(4-fluorobenzoyl)tolane.

A mixture of 48.8 g (0.150 Mol) of tri-n-butyl-tin chloride and 20.7 g (0.225 Mol) of lithium acetylide ethylenediamine complex in 300 mL of anhydrous THF was heated at reflux under argon for 24 hr, cooled and treated with 200 mL of water. The layers were separated and the THF phase was suction-filtered through Celite with a 150 mL THF wash to afford a clear solution. This solution was washed with water (3×200 mL), saturated aqueous sodium bicarbonate (2×100 mL), 5% HCl (2×100 mL), and dried over anhydrous sodium sulfate. Removal of the solvent gave 40.2 g (88%) of the bis(tri-n-butylstannyl)ethyne as a colorless liquid.

Into a 100 mL, 3-neck, round-bottom flask equipped with a magnetic stirrer, a thermocouple, and a condenser were placed 5.08 g (18.2 mMol) of 4-bromo-4'-fluorobenzophenone (Rieke Metals, Inc.), 0.50 g (0.43 mMol) of tetrakis(triphenylphosphine)palladium[0], and 25 mL of tetrahydrofuran (THF). After complete dissolution of all solids, a THF solution (15 mL) of the bis(tri-n-butylstannyl)acetylene (5.00 g, 8.28 mMol), prepared above, was added drop-wise to the reaction mixture. The reaction mixture was then heated at reflux for 24 hr under argon. An off- white crystal formed gradually during this period. The off-white crystals (2.30 g, 66% yield) were separated by filtration and washed with cold THF (3×30 mL). After further crystallization from toluene and subsequent drying, a white crystalline solid having a melting point of 249–250° C. was obtained.

Example A4

Preparation of 3,3'-BIS(4-FLUOROBENZOYL) TOLANE

Into a 100 mL, 3-neck, round-bottom flask equipped with a magnetic stirrer, a thermocouple, and a condenser were placed 10.16 g (36.4 mMol) of 3-bromo-4'-fluorobenzophenone (Rieke Metals, Inc.), 1.00 g (0.86 mMol) of tetrakis(triphenylphosphine)palladium[0], and 50 mL of tetrahydrofuran (THF). After complete dissolution of all solids, a THF solution (30 mL) of bis(tri-n-butylstannyl) acetylene (10.00 g, 16.56 mMol) (see Example A3b) was added drop-wise to the first solution. The reaction mixture was then heated at reflux for 24 hrs under argon. An off-white crystal formed gradually during this period. The off-white crystal (4.60 g, 66% yield) was separated by filtration and washed with cold THF (3×30 mL). After drying and recrystallization from toluene, a white crystalline solid having a melting point of 205–206° C. was obtained.

Example A5

Preparation of 4-FLUORO-4'- (4-FLUOROBENZOYL) TOLANE

Into a 250 mL, 3-neck, round-bottom flask equipped with a magnetic stirrer, a thermocouple, and a condenser were placed 12.00 g (100.0 mMol) of 1-ethynyl-4-fluorobenzene, 27.93 g (100.0 mMol) of 4-bromo-4'-fluorobenzophenone (Rieke Metals, Inc.), 1.5 g of tetrakis(triphenylphosphine) palladium[0], and 150 mL of de-aerated triethylamine. The reaction mixture was heated to 80° C. with stirring under argon for 3 hr and then cooled to ambient overnight (16 hr) with stirring. The reaction mixture was filtered to remove a white precipitate of triethylamine hydrobromide. The triethylamine solvent was evaporated and the solids obtained were dissolved in dichloromethane. The resulting solution was washed with water (2×50 mL), 2% HCl (2×50 mL), brine, and then dried over sodium sulfate. After removal of the solvent, the crude 4-fluoro-4'-(4-fluorobenzoyl)tolane was purified by silica gel column chromatography using hexanes as the elutant. White crystals having a melting point of 190–191° C. were obtained in a yield of 81%.

Example A6a

Preparation of 4-FLUORO-3'-(4-FLUOROBENZOYL)TOLANE

Into a 500 mL, 3-neck, round-bottom flask equipped with a magnetic stirrer, a thermocouple, and a condenser were placed 24.00 g (200.0 mMol) of 1-ethynyl-4-fluorobenzene (see examples A1 or A2), 55.82 g (200.0 mMol) of 3-bromo-4'-fluorobenzophenone (Rieke Metals, Inc.), 3.0 g of tetrakis (triphenylphosphine)palladium[0], and 300 mL of de-aerated triethylamine. The reaction mixture was heated to 80° C. with stirring under argon for 3 hr and then cooled to ambient; stirring was continued overnight (approximately 16 hr). The reaction mixture was filtered to remove a white precipitate of triethylamine hydrobromide. The triethylamine solvent was evaporated and the solids obtained dissolved in dichloromethane. The resulting solution was washed with water (2×100 mL), 2% HCl (2×100 mL), brine, and then dried over sodium sulfate. After removal of the solvent, the product was purified by silica gel column chromatography using hexanes as the elutant. After removal of the solvent, white crystals with a melting point of 127–128° C. were obtained in a yield of 85%.

Example A6b

Alternate Preparation of 4-FLUORO-3'-(4-FLUOROBENZOYL)TOLANE

Into a 250-mL, 3-neck round-bottom flask equipped with a magnetic stirrer, a thermocouple, and a condenser were placed 19.9 g (0.09 Mol) of 3-bromobenzoyl chloride (freshly prepared from 3-bromobenzoic acid in the presence of thionyl chloride) and 57.6 g (0.6 Mol) of fluorobenzene. The mixture was cooled to 0° C. and 13.5 g of anhydrous aluminum chloride was added. The mixture was stirred at ambient for 15 min, heated at reflux for 4 hr, cooled to ambient and stirred for an additional 16 hr (overnight). The resulting slurry was poured into 1 L of 5% aqueous hydrochloric acid. The organic layer was extracted with dichloromethane (3×100 mL) and the combined extracts dried over magnesium sulfate. After filtration, the solvent and unreacted fluorobenzene were removed under reduced pressure to yield a tan-colored residue. Recrystallization from ethanol afforded 12 g of white crystals (88% yield) of 3-bromo-4'-fluorobenzophenone having a melting point of 80–81° C.

In a 250-mL three-neck, round-bottom flask equipped with a magnetic stirrer, a thermocouple, and a condenser were placed 5.00 g (0.04 Mol) of 1-ethynyl-4-fluorobenzene, 11.16 g (0.04 Mol) of 3-bromo-4'-fluorobenzophenone (from the first step), 0.1 g of triphenylphosphine, 0.05 g of cuprous iodide, 0.05 g of dichlorobis(triphenylphosphine)palladium[II], and 200 mL of de-aerated triethylamine. The reaction mixture was heated to 80° C. with stirring under argon for 4 hr and then cooled to ambient with stirring for an additional 16 hr (overnight). The reaction slurry was filtered to remove the white precipitate of triethylamine hydrobromide. The triethylamine solvent was evaporated and the solid was dissolved in dichloromethane. The resulting solution was washed with water (2×100 mL), 2% HCl (2×100 mL), brine and then dried over sodium sulfate. After filtration and removal of the solvent, the product was purified by crystallization from acetone yielding 23 g (75%)of white crystals having a melting point of 130–131° C. In an alternative experiment, during which recrystallization was carried out in toluene, the recovered pure rhombic needles of the product had a melting point of 135–136° C.

Example A7

Preparation of α,δ-BIS (4-HYDROXY) SEXIPHENYLENE

To a 4 L beaker was added 100 g of sodium carbonate and 1 L of water which was stirred until all solids were dissolved. To this solution, 156.75 g (0.94 Mol) of 4-methoxyphenylacetic acid was added. To a 500 mL beaker was added 189.5 g (0.96 Mol) of $MnCl_2.4H_2O$ and 125 mL of water which was stirred until all solids were dissolved. The $MnCl_2$ solution was added with stirring to the solution in the 4 L beaker to give about 2.5 L of a pink foamy mixture. After adding 3 drops of octanol, the volume of the foamy mixture was decreased to about 1.5 L. The foamy mixture was washed with water, filtered and the solids dried in vacuum to give 211 g of a light pink powder. 100 g of this pink powder was distilled at 300–320° C. under vacuum during 30 minutes to afford 43.0 g (72% yield)of white crystals of 1,3-bis(4-methoxyphenyl)propanone (m.p. 75–76° C.).

A 350 mL round-bottom flask equipped with condenser and stirrer was charged with 23.3 g (0.11 Mol) of benzil in 200 mL of absolute alcohol and 30.0 g (0.11 Mol) of 1,3-bis(4-methoxyphenyl)propanone. The mixture was heated to incipient boiling, then a solution of 3.0 g of KOH in 20 mL of water was added. The mixture was heated to reflux for 30 min to form a purple-black slurry. The slurry was cooled, filtered and the solids washed with cold ethanol and dried in vacuum to afford 45.0 g (91% yield) of purple-colored crystalline α,α'-bis(4-methoxy)tetracyclone, having a melting point of 186–188° C.

To a 300 mL round-bottom flask equipped with a condenser, nitrogen inlet, thermometer and stirrer, 44.45 g (0.10 Mol) of the α,α'-bis(4-methoxy)tetracyclone and 19.61 g (0.11 Mol) of diphenylacetylene in 150 mL of sulfolane was added. The mixture was heated with stirring at 260–270° C. for 2 hr, the intense purple color turned into a light brown. The mixture was cooled and poured into 1 L of water with stirring and filtered. The solids were washed with water and dried in vacuum to give 58 g (97% yield) of white crystalline α,δ-bis(4-methoxy)sexiphenylene having a melting point of 328–330° C.

A 500 mL flask equipped with a nitrogen inlet, thermometer and stirrer was charged with 25 g (0.04 Mol) of the 4,4'-dimethoxysexiphenylene in 150 mL of $CH_2Cl_2$. The flask was cooled in a dry ice/acetone bath to reduce the temperature to approximately −78° C. and 169 mL of a 1 M solution of $BBr_3$ in $CH_2Cl_2$ was added. The mixture was allowed to warm to ambient and stirred for 12 hr. About 300 mL of the resulting mixture was poured into 1.5 L of water with stirring under a $N_2$ blanket. A rotary evaporator was used to distill of the $CH_2Cl_2$ and the remaining solution filtered. The solids were dried in vacuum to give 30 g of crude product. The crude product was purified by silica gel column chromatography, eluting with $CH_2Cl_2$ to afford 20 g (87% yield) of α,δ-bis(4-hydroxy)sexiphenylene as white crystals with a melting point of 447–449° C.

Example A8

Synthesis of 2,7-DIHYDROXYSPIRO(9',9'-FLUORENE-10,10-XANTHENE)

Fluorenone (22.5 g, 0.13 Mol) and resorcinol (45.0 g, 0.41 Mol), loaded in a 100 mL European style flask, equipped with a gas inlet-outlet port and thermometer, were heated to the molten state at 180–200° C. for 4.5 hr, while HCl was let in via the extended inlet tube and through the melt. Excess HCl gas was vented through via the outlet port into a HCl-absorbing aqueous pool. The brown viscous mass was poured out, cooled, crashed, extracted with water (3×500 mL), and dried. The resulting solid was extracted with boiling benzene (2×380 mL). The hot filtrates were combined and cooled; and the precipitated solid was filtered and dried, yielding 20.0 g (44%) of a crude product. The crude product was purified with flash chromatography, and then crystallization from acetonitrile, giving 7.3 g (16%) of pure 2,7-dihydroxyspiro(9',9'-fluorene-10,10-xanthene) as small white crystals having a melting point of 270–271° C.

B. Polymers

Examples B1–B3 are directed to the poly(arylene ether) polymers of difluoro-monomers (Ar) with diol-monomers (Y). In addition, Example B1 is illustrative of the method of end-capping the polymer. It will be understood that this additional step is optional.

Example B1

The polymerization of 4-FLUORO-3'-(4-FLUOROBENZOYL)TOLANE WITH 9,9'-BIS(4-HYROXYPHENYL)-FLUORENE AND END-CAPPED WITH 4-FLUOROBENZOPHENONE A 5-Liter, 3-neck round-bottom flask, equipped with an overhead mechanical stirrer, a thermocouple, a reflux condenser with a Dean-Stark trap assembly, and a nitrogen inlet-outlet connection, was purged with nitrogen for 1 hr prior to being charged with 1.0 L of warm sulfolane (80–100° C.). 175.21 g (0.50 Mol) of 9,9'-bis(4-hyroxyphenyl)-fluorene (fluorene bisphenol), 159.16 g (0.50 Mol) of 4-fluoro-3'-(4-fluorobenzoyl)tolane and 138.2 g (1.0 Mol) of anhydrous, pulverized potassium carbonate were added and rinsed with 665 mL of warm sulfolane and 825 mL of toluene. The reaction mixture was heated until boiling (approximately 140° C.) and azeotropic distillation began. The azeotropic distillation was continued for 1 hr while the temperature of the mixture gradually rose from 140° C. to 175° C. as recovered toluene was gradually removed from the Dean-Stark trap. The reaction was continued at 175° C. with constant azeotropic distillation during 15–27 hrs.

The temperature of the reaction mixture was slightly lowered to 165° C. and 12.0 g (0.06 Mol) of 4-fluorobenzophenone was added. The reaction mixture was maintained at 165° C. for an additional 5 hrs.

The reaction mixture was diluted with 800 mL of N-methylpyrrolidinone (NMP) and cooled to ambient. The solution was filtered and precipitated in 10 L of acidified methanol (0.03% nitric acid). The precipitate was filtered, washed with methanol (3×1 L), and dried in a vacuum oven over night at 60° C. The polymer solid was redissolved in 2 L of NMP and reprecipitated into 1OL of acidified methanol (0.01% nitric acid). The precipitate was filtered and washed with methanol (3×1 L), and dried in a vacuum oven at 90–100° C. until constant weight, approximately 24 hr. 304.6 g (96%) of the white polymer was obtained. A 15% solution of the polymer in cyclohexanone contained less than 50 ppb of any metal. After curing at 400° C. for 1 hr under nitrogen, the polymer demonstrated a glass transition temperature (Tg) 400–450° C.

Example B2

The polymerization of 3,3'-BIS(4-FLUOROBENZOYL)TOLANE WITH 9,9'-BIS(4-HYDROXYPHENYL)-FLUORENE A 250 mL 3-neck round-bottom flask, equipped with a magnetic stirrer, a thermocouple, a reflux condenser with a Dean-Stark trap assembly, and a nitrogen inlet-outlet connection, was purged with nitrogen for 1 hr prior to being charged with 11.831 g (0.034 Mol) of 9,9'-bis(4-hyroxyphenyl)-fluorene (fluorene bisphenol), 14.260 g (0.034 Mol) of 3,3'-bis(4-fluorobenzoyl)tolane, and 9.34 g (0.068 Mol) of anhydrous, pulverized potassium carbonate were added and rinsed with 135 mL of N-methylpyrrolidinone (NMP) and 75 mL of toluene. The reaction mixture was heated until boiling (approximately 140° C.) and azeotropic distillation began. The azeotropic distillation was continued for 1 hr while the temperature of the mixture gradually rose to 160° C. as recovered toluene was gradually removed from Dean-Stark trap. The reaction was continued at 160–165° C. with constant azeotropic distillation for an additional 3 hrs.

The reaction mixture was diluted with 50 mL of NMP and filtered at 140° C. The filtered solution was cooled to room temperature and precipitated in 1.5 L of acidified methanol (0.03% nitric acid). The precipitate was filtered, washed 3 times with methanol, and dried in a vacuum oven over night at 60° C. The polymer solid was redissolved in 250 mL of NMP and reprecipitated into 1.5 L of acidified methanol (0.01% nitric acid). The precipitate was filtered and washed with methanol (3×1 L) and dried in a vacuum oven at 90–100° C. until constant weight, approximately 24 hours, giving 23.2 g (95%) of the white polymer. A 15% solution of the polymer in cyclohexanone contained less than 50 ppb of any metal. After curing at 400° C. for 1 h under nitrogen, the polymer shows a $T_g$>400° C.

Example B3

The polymerization of 4-FLUORO-3'-(4-FLUOROBENZOYL)TOLANE WITH 4,4'-DIHYDROXYSEXIPHENYLENE A 250 mL, 3-neck round-bottom flask equipped with an magnetic stirrer, a thermocouple, a reflux condenser with a Dean-Stark trap assembly, and a nitrogen inlet-outlet connection, was purged with nitrogen for an hour prior to being charged with 8.501 g (0.015 Mol) of 4,4'-dihydroxysexiphenylene, 4.775 g (0.015 Mol) of 4-fluoro-3'-(4-fluorobenzoyl)tolane, and 4.15 g (0.030 Mol) of anhydrous, pulverized potassium carbonate were added and rinsed with 80 mL of warm sulfolane and 20 mL of toluene. The reaction mixture was heated until boiling (approximately 140° C.) and azeotropic distillation began. The azeotropic distillation was continued for 1hr while the temperature of the mixture gradually rose from 140° C. to 180° C. as recovered toluene was gradually removed from the Dean-Stark trap. The reaction was continued at 180° C. with constant azeotropic distillation for 16 hrs. The reaction mixture was diluted with 35 mL of N-methylpyrrolidinone (NMP) and filtered warmly. The filtered solution was precipitated in 1 L of acidified methanol (0.03% nitric acid). The precipitate was filtered, washed with methanol (3×1 L), and dried in a vacuum oven over night at 60° C. The polymer solid was redissolved in 75 mL of NMP and reprecipitated into 1 L of acidified methanol (0.01% nitric acid). The precipitate was filtered, washed with methanol (3×1 L), and dried in a vacuum oven at 90–100° C. until constant weight, approximately 24 hr, giving 12.0 g (94%) of the white polymer. A 15% solution of the polymer in cyclohexanone contained less than 50 ppb of any metal. After curing at 400° C. for 1 h under nitrogen, the polymer shows a Tg 400–450° C.

C. Polymer Applications

Example C1

Preparation of Coating Solution

A 13% solution of a poly(arylene ether) corresponding to Example B1 is prepared by dissolving an appropriate weight of the solid polymer in cyclohexanone under ambient conditions in a glass lined reactor. The solution is then filtered through a series of four Teflon® filtration cartridges. The filtration cartridges have decreasing nominal pore sizes of 1.0, 0.5, 0.2 and 0.1 $\mu$m, respectively.

Example C2

Preparation of Film Coated Substrates

Between approximately 3 to 7 milliliters (mL) of the filtered solution of Example C1 was processed onto the surface of an eight inch silicon wafer using a spin coater and hot plate oven track, for example a Silicon Valley Group, Inc. (SVG) Model No. 8828 coater and SVG Model No. 8840 oven track. The spin-bake-cure recipes employed are in accordance with the recipes previously set forth in Table 1, where the ambient temperature is approximately 22° C. and spin-cup pressure and humidity are 20 to 30 mmHg and 40%, respectively. The various thermochemical and electrical properties of the film so produces are illustrated in Table 2, below.

TABLE 2

| PROPERTY | B1 | B2 | B3 |
|---|---|---|---|
| Organic Content | 100% | 100% | 100% |
| Polymer Purity (9 metals) | <50 ppb | <50 ppb | <50 ppb |
| Cured Film Thickness | 1 $\mu$m | 1 $\mu$m | 1 $\mu$m |
| Film Thickness Uniformity | >99% | >99% | >99% |
| Dielectric Constant MIM parallel plate, 1 MHz | 2.84 | 2.84 | 2.85 |
| Refractive Index | | | |
| (in-plane) | 1.6705 | not measured | not measured |
| (out-of-plane) | 1.6645 | not measured | not measured |
| $\Delta n_D$ | 0.006 | not measured | not measured |
| Tg | >400° C. | >400° C. | >400° C. |
| Residual Stress | 60 MPa | 60 MPa | 60 MPa |
| $\Delta$ Stress 3 × (RT–450° C.) Cycles | none | none | none |
| Isothermal Weight Loss | | | |
| @ 450° C., 2 hr | <2% | <2% | <2% |
| @ 425° C., 8 hr | 1.44% | not measured | not measured |
| Thermal Stability to 400° C. | no out-gassing | no out-gassing | no out-gassing |
| Gap-fill (0.8 $\mu$m depth) | 0.13 $\mu$m (SiO$_2$) | 0.13 $\mu$m (SiO$_2$) | 0.13 $\mu$m (SiO$_2$) |
| Planarization over 0.8 $\mu$m high metal lines | 84% | not measured | not measured |
| Adhesion, Stud Pull Values | >11k psi | >8k psi | >8k psi |
| Crack Threshold | >2 $\mu$m | >2 $\mu$m | >2 $\mu$m |
| Solvent Resistance (NMP, 90° C., 24 h) | no swelling | no swelling | no swelling |
| Solvent Resistance Post-etch cleaning solvents, immersion 25° C., 70° C. 1 hr | Resistant toward solvent-induced delamination | not measured | not measured |
| Moisture uptake | 0.44% | not measured | not measured |
| Metal Line Corrosion | None | None | None |
| Cure Atmosphere | inert | inert | inert |

In view of the foregoing, it will be understood that embodiments of the present invention have been enabled that advantageously provide poly(arylene ether) polymers that exhibit a Tg in excess of 350° C., a dielectric constant between 2.0 and 3.0, gap-filling capability for gaps of 0.25 $\mu$m or less, excellent adhesion to commonly employed surfaces, low stress, little or no out-gassing, excellent planarization of non-planar surfaces, and very low trace metal content. In addition, it will be realized that methods for making the aforementioned polymers have also been provided herein, as well as synthetic methods for producing monomers. It will be further realized that the use of the aforementioned polymers for interlayer dielectrics in multilayer metal interconnect structures has been demonstrated for semiconductor integrated circuits as well as for multichip modules and other microelectronic devices.

Thus, the poly(arylene ether) composition of Example B1 provides a Tg in excess of 400° C., a dielectric constant of 2.8, less that 50 ppb of trace metals, essentially no outgassing below 400° C., gap fill capability equal to or better than 0.15 μm and the ability to achieve an 85% planarization of non-planar surfaces as described above. Embodiments of the present invention employing other poly(arylene ether) polymers in accordance with the present invention have provide similar characteristics to those of the polymer of Example B1 as seen in Table 2.

Some embodiments of the present invention enable using the aforementioned polymers as a dielectric material for a microelectronic device such as an IC a PCB or a multichip module. For some embodiments, coating a semiconductor substrate with a film of such aforementioned polymers has been enabled; and for some embodiments use of such aforementioned polymers for multichip modules has been enabled.

Thus, it will evident that embodiments of the present invention have been described that provide solutions for the previously mentioned problems without the use of adhesion promoters and without the presence of reactive fluorine moieties.

It will also be understood that the method of making the polymers contained herein include an optimal processing approach to attain high-quality thin films through controlled cure under an inert ambient. It will be further understood that the method for making the monomers of the poly (arylene ethers) of this invention includes catalyzed coupling of commercially available pre-monomers to provide novel tolane-type ethynylated aromatic monomers advantageously used in the polymerization method of this invention to make high glass transition temperature poly(arylene ethers).

We claim:

1. A poly(arylene ether) having the structure:

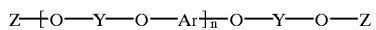

wherein Y is a first divalent arylene radical selected from a first group consisting of:

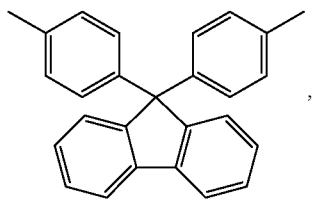

-continued

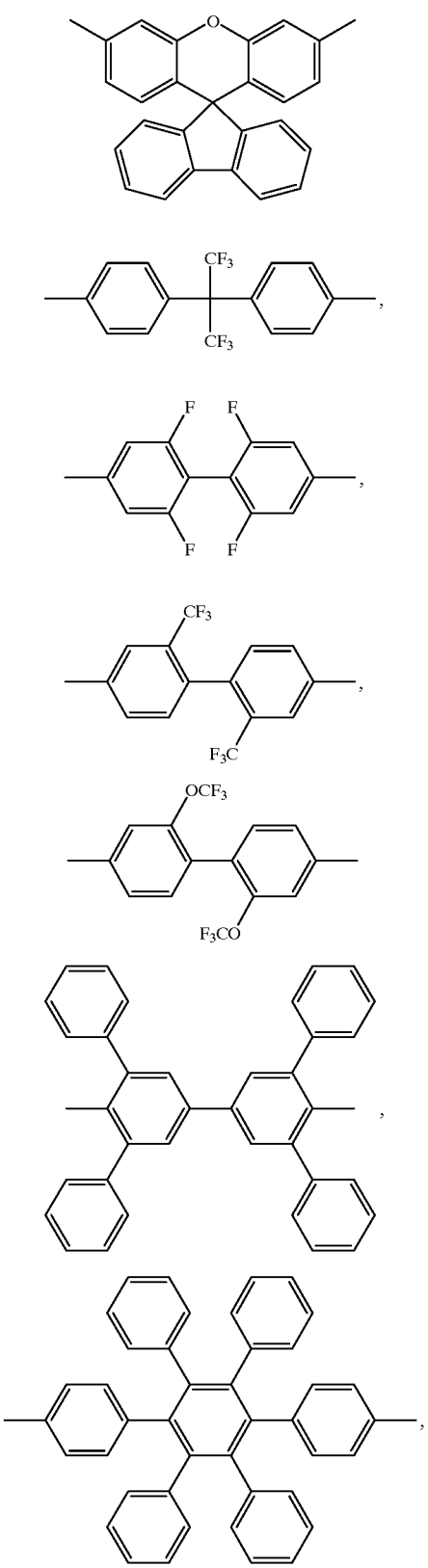

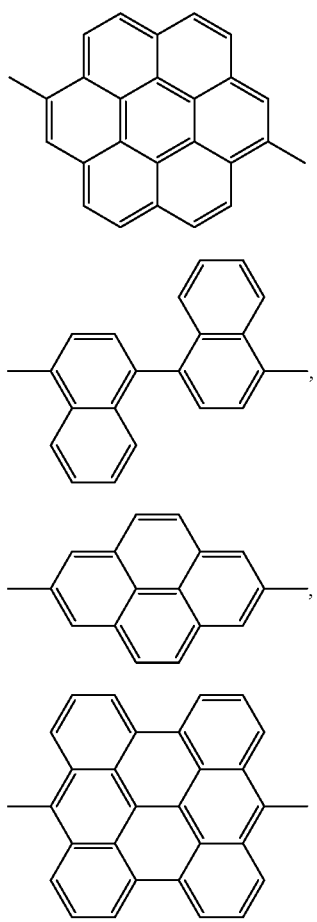
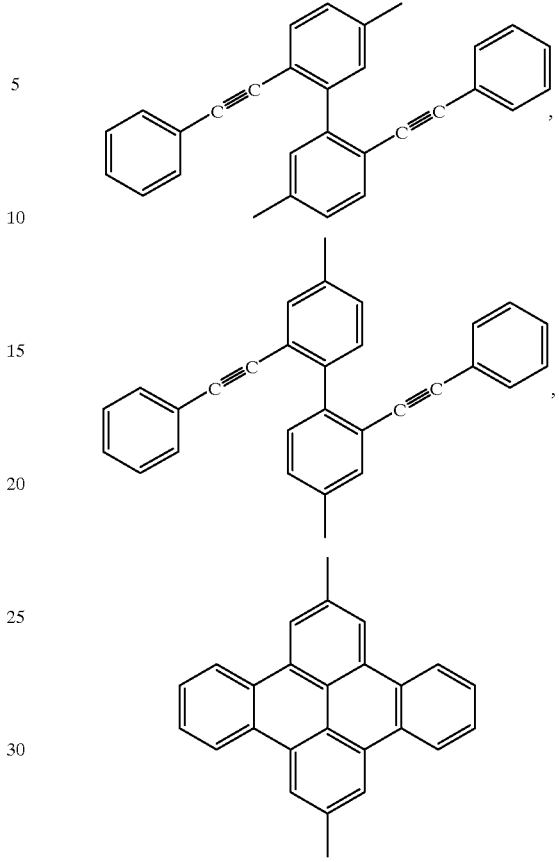
and mixtures thereof;
Ar is a second divalent arylene radical selected from a second group consisting of:
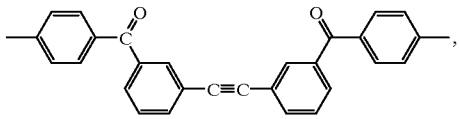
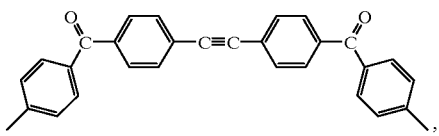
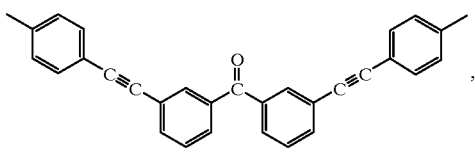

-continued
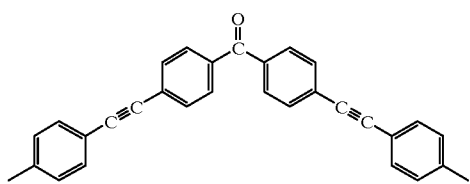
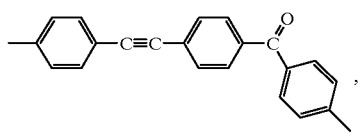
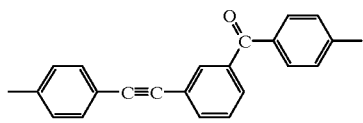
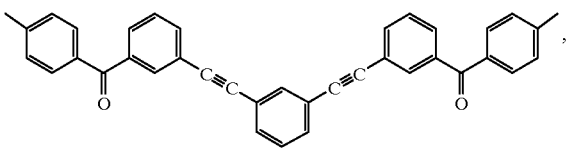
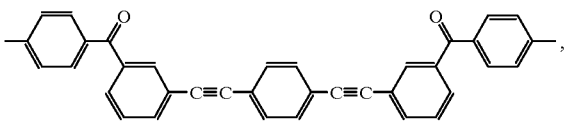
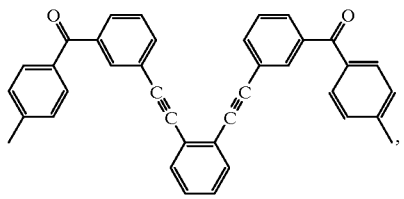
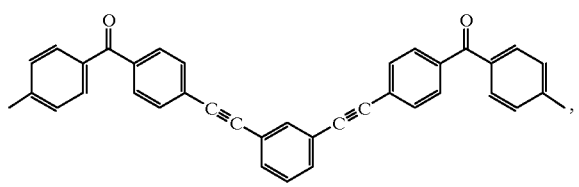

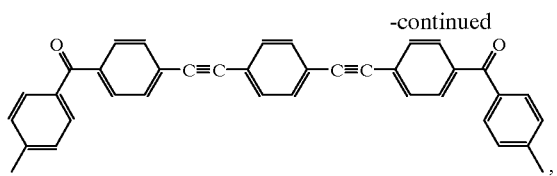

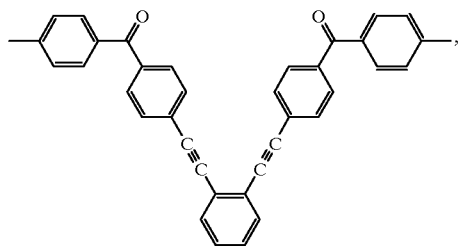

and mixtures thereof;

n is between 1 and 200; and

Z is either H, CH$_3$ or is a monovalent aryl radical selected from the group consisting of:

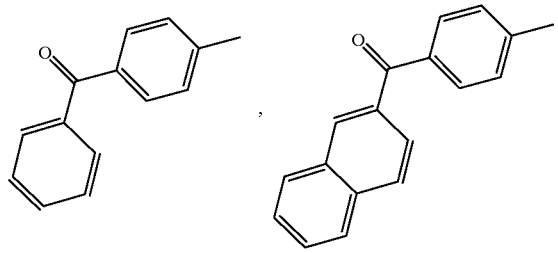

2. The poly(arylene ether) of claim 1 wherein:
Y has the structure:

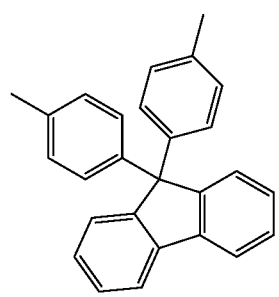

and; Ar has the structure:

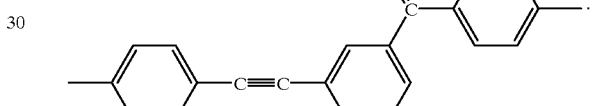

3. The poly(arylene ether) as in claim 2 wherein n is between approximately 5 and 60.

4. The poly(arylene ether) as in claim 2 wherein n is between approximately 10 and 50.

5. The poly(arylene ether) as in claim 1 wherein:

Y has the structure:

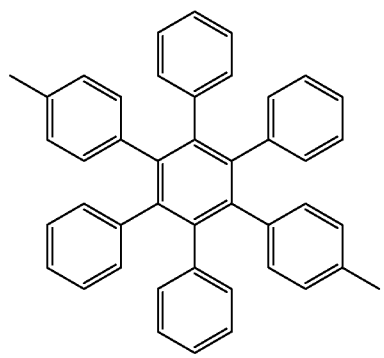

and; Ar has the structure:
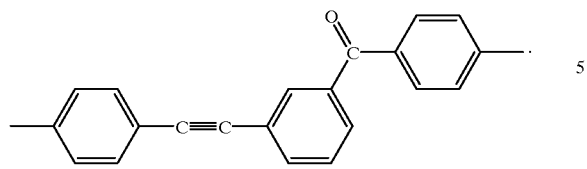
6. The poly(arylene ether) as in claim 5 wherein n is between approximately 5 and 60.
7. The poly(arylene ether) as in claim 5 wherein n is between approximately 10 and 50.
8. A process for producing a poly(arylene ether) having the structure:
wherein Y is a first divalent arylene radical selected from a first group consisting of:
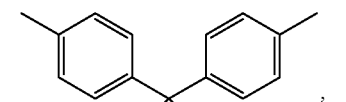
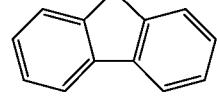
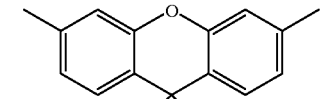
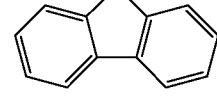
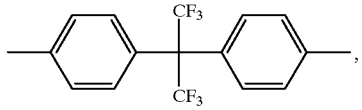
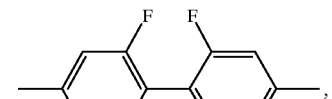
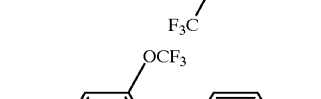
-continued
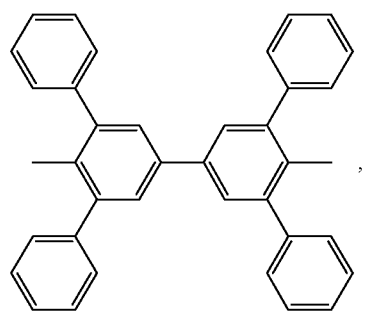
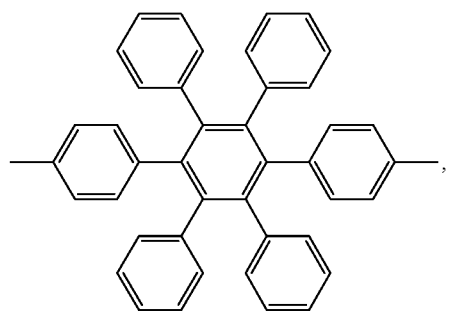
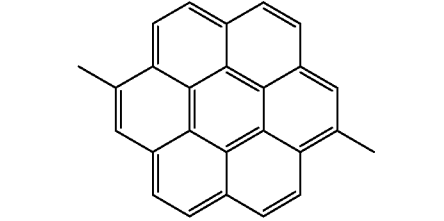
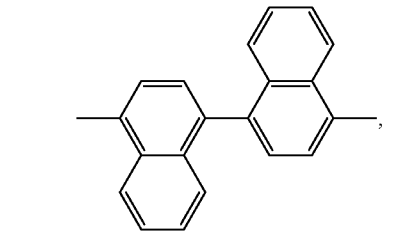
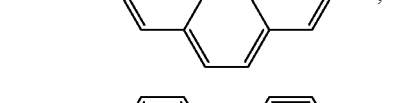
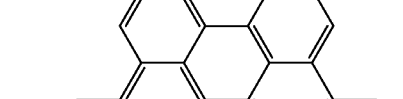
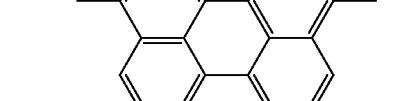

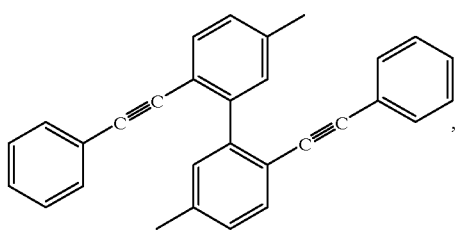
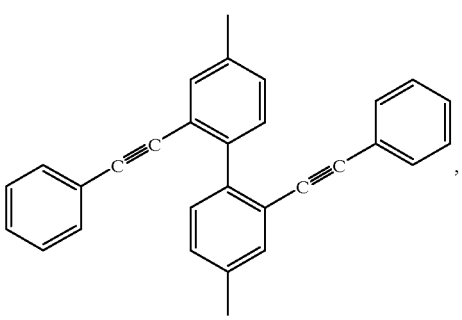
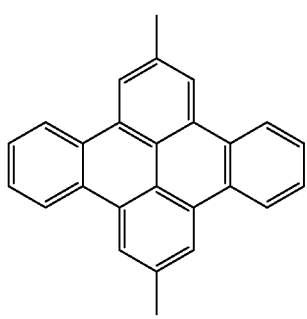
and mixtures thereof;
Ar is a second divalent arylene radical selected from a second group consisting of:
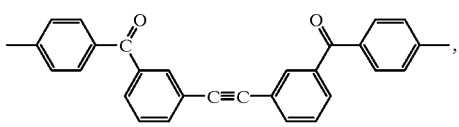
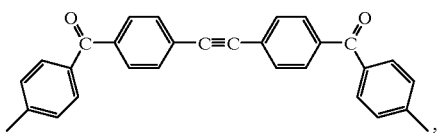
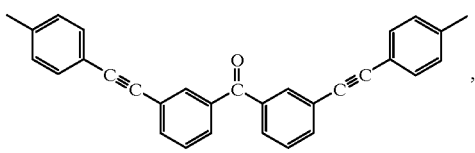
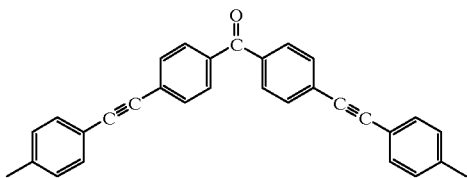
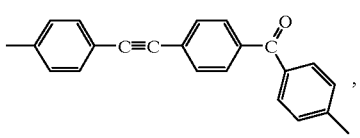

-continued
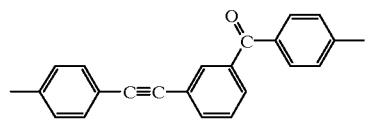
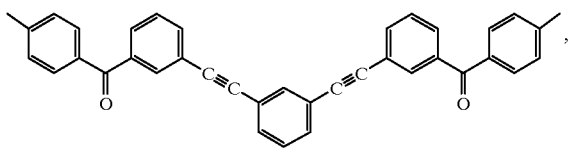
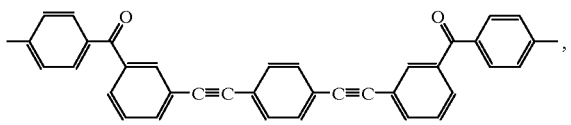
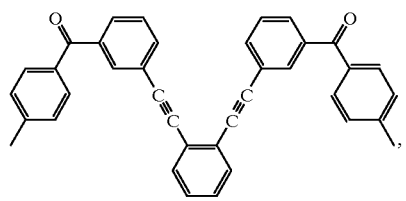
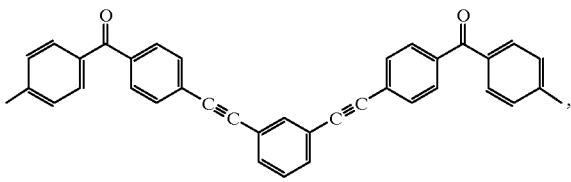
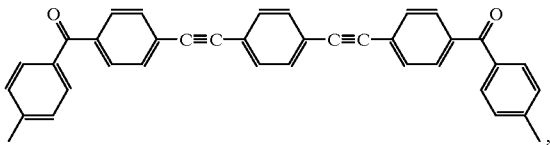
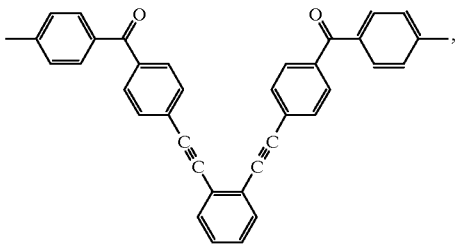

and mixtures thereof;

n is between 1 and 200;

and Z is hydrogen, a methyl group or a monovalent aryl radical selected from the group consisting of:

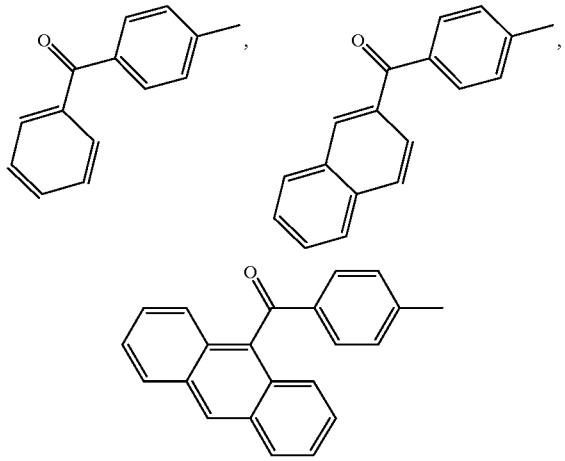

comprising the steps of:
charging a reaction vessel with a first monomer of the structure HO—Y—OH, a second monomer of the structure, F—Ar—F and a solvent, wherein a reaction mixture is provided; and
heating said reaction mixture for a first time to provide polymerization of said monomers.

9. The process for producing a poly(arylene ether) as in claim 8 wherein heating said reaction mixture comprises heating to a first temperature sufficiently high to begin azeotropic distillation of said reaction mixture to provide an azeotropic distillate.

10. A process for producing a poly(arylene ether) as in claim 9 wherein heating said reaction mixture to a first temperature comprises removing a portion of said azeotropic distillate, wherein the first temperature is increased to a second temperature.

11. A process for producing a poly(arylene ether) as in claim 8 wherein said solvent is a mixture of a first solvent selected from the group consisting essentially of N-methyl-2-pyrrolidinone (NMP), N,N-dimethyl acetamide (DMAC) and sulfolane, and a second solvent selected from the group consisting essentially of toluene and benzene.

12. A process for producing a poly(arylene ether) as in claim 11 wherein said solvent is a mixture of sulfolane and toluene.

13. A process for producing a poly(arylene ether) as in claim 8 wherein the reaction vessel is charged with 4-fluoro-3'-(4-fluorobenzoyl)tolane and 9,9'-bis(4-hydroxyphenyl)-fluorene having a 1:1 molar ratio.

14. A process for producing a poly(arylene ether) as in claim 8 wherein the reaction vessel is charged with 3,3'-bis(4-fluorobenzoyl)tolane and 9,9'-bis(4-hydroxyphenyl)-fluorene having a 1:1 molar ratio.

15. A process for producing a poly(arylene ether) as in claim 8 wherein the reaction vessel is charged with 4-fluoro-3'-(4-fluorobenzoyl)tolane and α,δ-bis(4-hydroxy)sexiphenylene having a 1:1 molar ratio.

16. A process for producing a poly(arylene ether) as in claim 8 comprising providing methyl chloride gas to the reaction mixture, after the first time.

17. A microelectronic device comprising a dielectric layer disposed overlying a surface, wherein said dielectric layer comprises a poly(aryl ether) having repeating units of the structure:

wherein Y is a first divalent arylene radical selected from a first group consisting of:

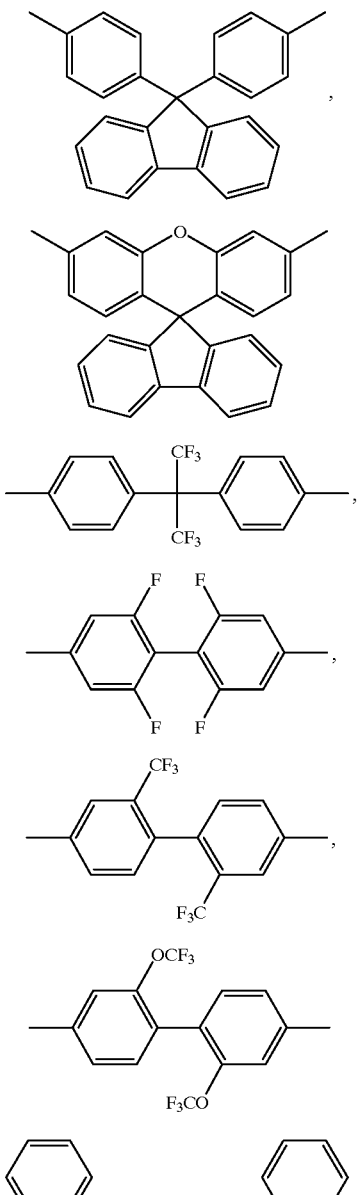

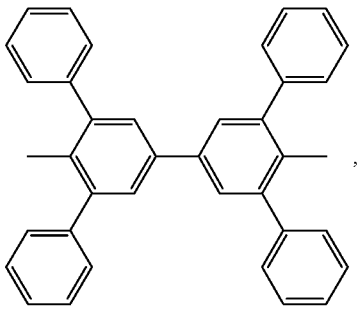

-continued
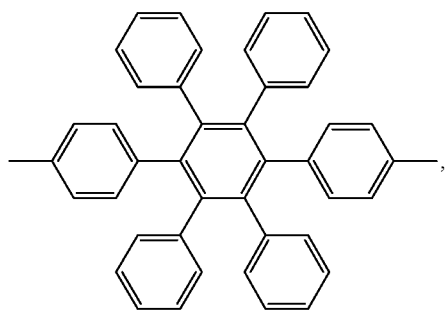
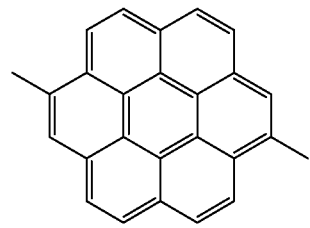
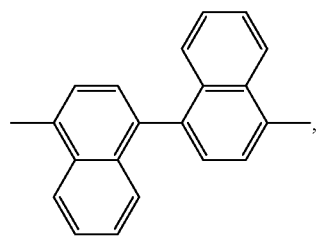
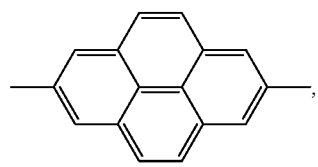
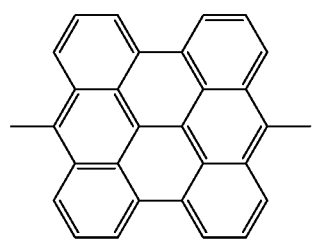
-continued
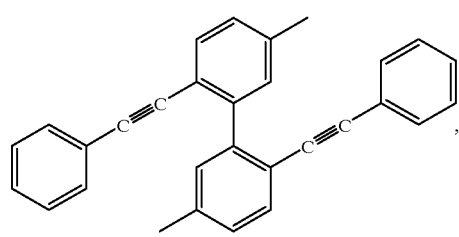
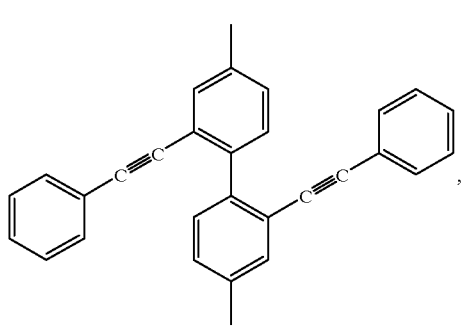
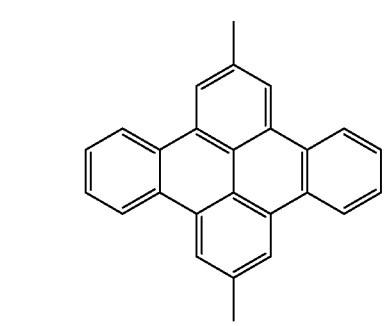
and mixtures thereof;
Ar is a second divalent arylene radical selected from a second group consisting of:
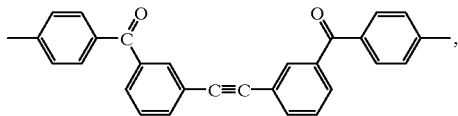
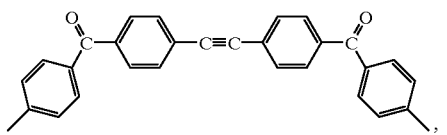

-continued
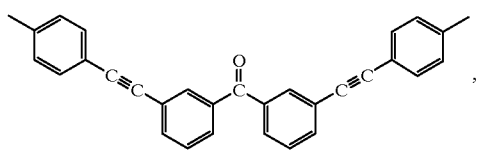,
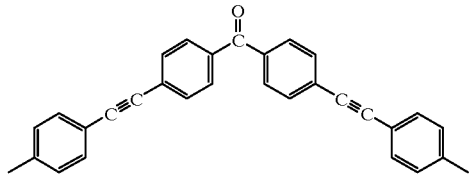
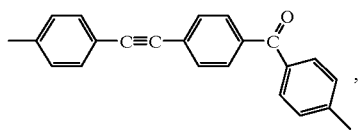,
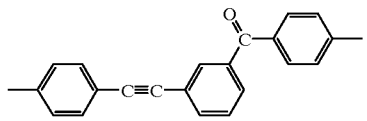,
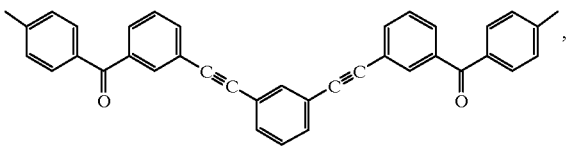,
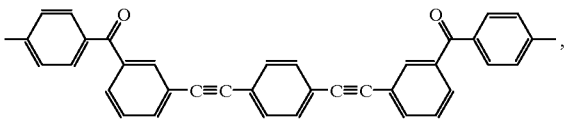,
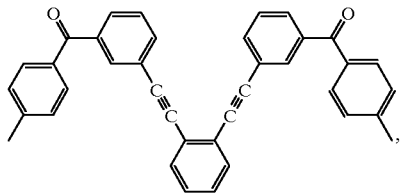, -continued

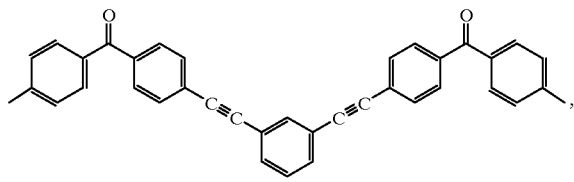

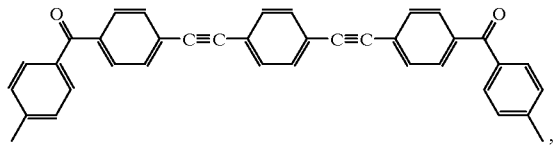

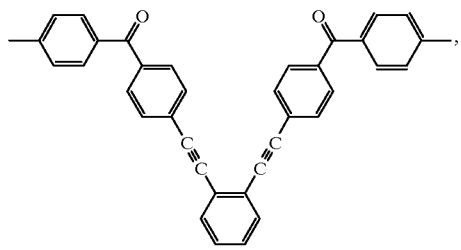

and mixtures thereof; and
n is between 1 and 200; and
Z is either H, $CH_3$ or is a monovalent arylene radical selected from the group consisting of:

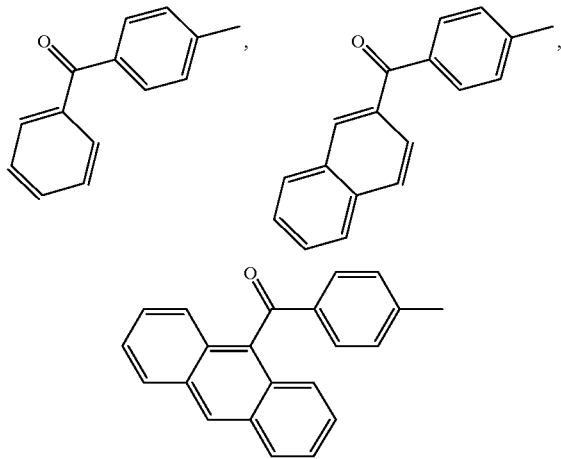

18. A microelectronic device comprising a dielectric layer, as in claim 17 wherein said surface comprises silicon oxide and/or aluminum, and wherein said dielectric layer has an adhesion of at least 7,500 pounds per square inch to said surface, a dielectric constant less than 3.0 and a glass transition temperature of at least 350° C.

19. A microelectronic device comprising a dielectric layer, as in claim 18 wherein said dielectric layer has a film thickness uniformity of at least 99 per cent and a gap fill ability, for gaps having a depth of up to 0.8 micron, of less than or equal to 0.25 micron.

20. A microelectronic device comprising a dielectric layer, as in claim 17 wherein:

Y of said poly(arylene ether) has the structure:

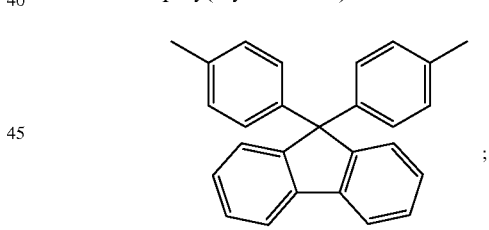

and
Ar of said poly(arylene ether) has the structure

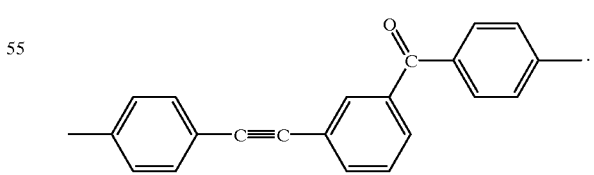

21. A microelectronic device comprising a dielectric layer, as in claim 20 wherein n of said poly(arylene ether) is between approximately 10 and 50.

22. A microelectronic device comprising a dielectric layer, as in claim 21 wherein said surface comprises silicon oxide and/or aluminum, and wherein said dielectric layer has an adhesion of at least 8,000 pounds per square inch to said surface, a dielectric constant less than 3.0 and a glass transition temperature of at least 400° C.

23. A microelectronic device comprising a dielectric layer, as in claim 22 wherein said dielectric layer has a film thickness uniformity of at least 99 per cent and a gap fill ability, for gaps having a depth of up to 0.8 micron, of less than or equal to 0.13 micron.

24. A microelectronic device comprising a dielectric layer, as in claim 17 wherein:

Y of said poly(arylene ether) has the structure:

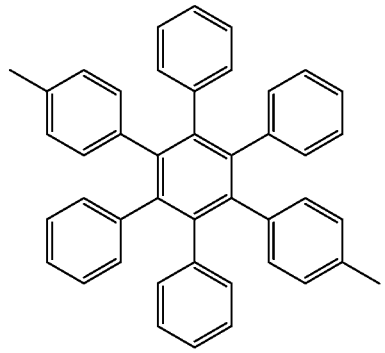

and

Ar of said poly(arylene ether) has the structure

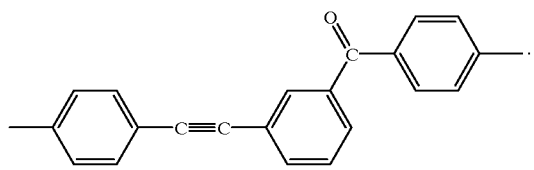

25. A microelectronic device comprising a dielectric layer, as in claim 24 wherein n of said poly(arylene ether) is between approximately 10 and 50.

26. A microelectronic device comprising a dielectric layer, as in claim 25 wherein said surface comprises silicon oxide and/or aluminum, and wherein said dielectric layer has an adhesion of at least 8,000 pounds per square inch to said surface, a dielectric constant less than 3.0 and a glass transition temperature of at least 400° C.

27. A microelectronic device comprising a dielectric layer, as in claim 24 wherein said dielectric layer has a film thickness uniformity of at least 99 per cent and a gap fill ability, for gaps having a depth of up to 0.8 micron, of less than or equal to 0.13 micron.

28. A method for synthesizing a fluoro-substituted-(4-fluorobenzoyl)tolane comprising the conversion of a bromo-4'-fluorobenzophenone in the presence of 1-ethynl-4-fluorobenzene, a catalyst, and a de-aerated, aprotic solvent to provide said fluoro-substituted-(4-fluorobenzoyl)tolane.

29. A method for synthesizing a fluoro-substituted-(4-fluorobenzoyl)tolane as in claim 28 wherein said fluoro-substituted-(4-fluorobenzoyl)tolane is 4-fluoro-3'-(4-fluorobenzoyl)tolane and said bromo-4'-fluorobenzophenone is 3-bromo-4'-fluorobenzophenone.

30. A method for synthesizing a fluoro-substituted-(4-fluorobenzoyl)tolane as in claim 28 wherein said fluoro-substituted-(4-fluorobenzoyl)tolane is 4-fluoro-4'-(4-fluorobenzoyl)tolane and said bromo-4'-fluorobenzophenone is 4-bromo-4'-fluorobenzophenone.

31. A method for synthesizing 4-fluoro-3'-(4-fluorobenzoyl)tolane comprising:

charging a reaction vessel with 3-bromobenzoic acid, thionyl chloride and fluorobenzene to provide a first reaction mixture;

cooling said first reaction mixture and adding anhydrous aluminum chloride to provide a second reaction mixture;

heating said second reaction mixture wherein a 3-bromo-4'-fluorobenzophenone intermediate is provided;

charging a second reaction vessel with said 3-bromo-4'-fluorobenzophenone intermediate, 1-ethynyl-4-fluorobenzene, triphenylphosphine, a catalyst and a de-aerated solvent to from a second reaction mixture;

heating said second reaction mixture wherein 4-fluoro-3'-(4-fluorobenzoyl)tolane is provided.

32. A method for synthesizing a bis(4-fluorobenzoyl)tolane comprising:

charging a reaction vessel with a bromo-4'-fluorobenzophenone, a catalyst, and anhydrous THF as a solvent to provide a reaction mixture;

adding dropwise a solution of a bis(tri-n-butylstannyl) compound in said solvent;

heating said reaction mixture in an inert atmosphere to form crystals;

purifying said crystals wherein a bis(4-fluorobenzoyl)tolane is provided.

33. A method for synthesizing a bis(4-fluorobenzoyl)tolane as in claim 32 wherein said bis(4-fluorobenzoyl)tolane is 4,4'-bis(4-fluorobenzoyl)tolane, said bromo-4'-fluorobenzophenone is 4-bromo-4'-fluorobenzophenone, and said bis(tri-n-butylstannyl) compound is bis(tri-n-butylstannyl)ethyne.

34. A method for synthesizing a bis(4-fluorobenzoyl)tolane as in claim 32 wherein said bis(4-fluorobenzoyl)tolane is 3,3'-bis(4-fluorobenzoyl)tolane, said bromo-4'-fluorobenzophenone is 3-bromo-4'-fluorobenzophenone and said bis(tri-n-butylstannyl)compound is bis(tri-n-butylstannyl) acetylene.

* * * * *